(12) United States Patent
Yuan et al.

(10) Patent No.: US 7,061,577 B2
(45) Date of Patent: Jun. 13, 2006

(54) IMAGE ADJUSTOR INCLUDING DAMPING ASSEMBLY

(75) Inventors: Bausan Yuan, San Jose, CA (US); Martin Lee, Saratoga, CA (US); Takeshi Asami, Palo Alto, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 10/107,269

(22) Filed: Mar. 26, 2002

(65) Prior Publication Data

US 2004/0046947 A1 Mar. 11, 2004

(51) Int. Cl.
G03B 27/42 (2006.01)
G03B 27/58 (2006.01)
G03B 27/32 (2006.01)

(52) U.S. Cl. .............. 355/53; 355/72; 355/77
(58) Field of Classification Search ........ 355/52, 355/53, 72, 75
See application file for complete search history.

(56) References Cited

U.S. PATENT DOCUMENTS

| | | | |
|---|---|---|---|
| 4,444,492 A | 4/1984 | Lee | |
| 4,821,205 A | 4/1989 | Schutten et al. | |
| 5,208,497 A | 5/1993 | Ishii et al. | |
| 5,227,839 A | 7/1993 | Allen | |
| 5,255,051 A | 10/1993 | Allen | |
| 5,625,436 A * | 4/1997 | Yanagihara et al. | 355/53 |
| 5,729,331 A * | 3/1998 | Tanaka et al. | 355/53 |
| 5,815,246 A | 9/1998 | Sperling et al. | |
| 5,864,389 A | 1/1999 | Osanai et al. | |
| 5,864,433 A * | 1/1999 | Takahashi et al. | 359/637 |
| 5,969,441 A | 10/1999 | Loopstra et al. | |
| 5,991,005 A | 11/1999 | Horikawa et al. | |
| 6,028,376 A | 2/2000 | Osanai et al. | |
| 6,252,370 B1 | 6/2001 | Ebihara et al. | |
| 6,262,794 B1 | 7/2001 | Miyajima | |
| 6,262,796 B1 * | 7/2001 | Loopstra et al. | 355/53 |
| 6,271,606 B1 | 8/2001 | Hazelton | |
| 6,281,654 B1 | 8/2001 | Lee | |
| RE37,361 E | 9/2001 | Yanagihara et al. | |
| 6,322,060 B1 | 11/2001 | Mayama et al. | |
| 6,323,483 B1 | 11/2001 | Cleveland et al. | |
| 6,323,935 B1 | 11/2001 | Ebihara et al. | |
| 6,337,484 B1 | 1/2002 | Loopstra et al. | |
| 6,359,679 B1 | 3/2002 | Ito et al. | |
| 6,408,045 B1 | 6/2002 | Matsui et al. | |
| 6,449,030 B1 | 9/2002 | Kwan | |
| 6,493,062 B1 | 12/2002 | Tokuda et al. | |
| 6,522,386 B1 * | 2/2003 | Nishi | 355/52 |
| 6,522,390 B1 * | 2/2003 | Suzuki et al. | 355/53 |
| 6,545,746 B1 * | 4/2003 | Nishi | 355/53 |

(Continued)

FOREIGN PATENT DOCUMENTS

JP 7-142331 6/1995

(Continued)

Primary Examiner—Alan Mathews
(74) Attorney, Agent, or Firm—Steven G. Roeder; Jim Rose

(57) ABSTRACT

An adjuster assembly (12) that adjusts the location where an image (18) from an object (20) is transferred onto a device (16) includes an adjuster (54) and a stage mover assembly (244). The stage mover assembly (244) adjusts the position of the adjuster (54). This moves the position where the image (18) is transferred onto the device (16). The adjuster assembly (12) can include a damper assembly (250) that is coupled to the stage mover assembly (244) and reduces the effect of vibration from the stage mover assembly (244) causing vibration on the rest of the apparatus.

139 Claims, 17 Drawing Sheets

U.S. PATENT DOCUMENTS 6,836,093 B1 * 12/2004 Nishi .................. 318/649

FOREIGN PATENT DOCUMENTS

| | | |
|---|---|---|
| JP | 11-362591 | 12/1999 |
| WO | WO 98/28665 | 7/1998 |
| WO | WO 98/40791 | 9/1998 |
| WO | WO 01/47001 A1 | 6/2001 |

* cited by examiner

IMAGE ADJUSTOR INCLUDING DAMPING ASSEMBLY

FIELD OF THE INVENTION

The present invention is directed to an image adjustor for an exposure apparatus. Additionally, the present invention is directed to an image adjustor including a damping assembly for an exposure apparatus.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a projection optical assembly and a wafer stage assembly that retains a semiconductor wafer. With the exposure apparatus, the reticle stage assembly positions the reticle and the wafer stage assembly positions the wafer so that when the reticle is illuminated by the illumination source, an image from the reticle is projected onto the desired location on the wafer.

Typically, the wafer stage assembly includes a wafer stage base, a wafer stage that retains the wafer, and a wafer stage mover assembly that precisely positions the wafer stage and the wafer. Somewhat similarly, the reticle stage assembly includes a reticle stage base, a reticle stage that retains the reticle, and a reticle stage mover assembly that precisely positions the reticle stage and the reticle. The size of the features within the images transferred onto the wafer from the reticle is extremely small. Accordingly, the precise relative positioning of the wafer and the reticle is critical to the manufacturing of high density, semiconductor wafers.

Unfortunately, the wafer stage assembly can incorrectly position the wafer and/or the reticle stage assembly can incorrectly position the reticle. As a result thereof, an alignment error can exist between where the image from reticle is projected onto the wafer and the desired location for the image on the wafer. This degrades the accuracy of the exposure apparatus.

In light of the above, there is a need for device and method for accurately adjusting the projected image from the reticle. Additionally, there is a need for a device and method for compensating for alignment errors between the reticle and the wafer. Moreover, there is a need for an exposure apparatus capable of manufacturing precision devices such as high density, semiconductor wafers.

SUMMARY

The present invention is directed to an adjuster assembly that adjusts the location where an image from an object is transferred onto a device. The adjuster assembly includes an adjuster optical element and a stage mover assembly that adjusts the position of the adjuster optical element relative to the device so that the adjuster optical element selectively adjusts where the image is transferred onto the device. Stated another way, the stage mover assembly selectively moves the adjuster optical element to selective shift the location where the image is transferred to the device. The adjuster assembly can be used as part of an exposure apparatus.

As provided herein, the stage mover assembly moves the adjuster optical element between a first position and a second position relative to the device. In the first position, the adjuster optical element does not substantially adjust where the image is transferred onto the device. However, in the second position, the adjuster optical element adjusts where the image is transferred onto the device. More specifically, the adjuster optical element includes an adjuster optical axis. In the first position, the adjuster optical axis is substantially perpendicular to the device. Alternately, in the second position, the stage mover assembly tilts the adjuster optical element about an X axis and/or about a Y axis. The amount of tilt can vary according to a number of factors, including the amount of image shifting desired, the design of the adjuster optical element and the design of the projection optical assembly. For example, the stage mover assembly can tilt the adjuster optical element between approximately zero and 50 microradians or alternately, the stage mover assembly can tilt the adjuster optical element between approximately zero and 5 milliradians relative to the device.

In some embodiments, the adjuster assembly includes a damper assembly that is coupled to the stage mover assembly. The damper assembly reduces the effect of vibration from the stage mover assembly causing vibration on the rest of the apparatus. As provided herein, the damper assembly can dampen vibration about the X axis and/or about the Y axis.

A number of alternate embodiments of the damper assembly are provided herein. In some of these embodiments, the damper assembly includes a reaction counter mass and a mass mover assembly. As provided herein, when the stage mover assembly moves the adjuster optical element about an X axis in a first X rotational direction, the mass mover assembly moves the reaction counter mass about the X axis in a second X rotational direction that is substantially opposite the first X rotational direction. Similarly, when the stage mover assembly moves the adjuster optical element about a Y axis in a first Y rotational direction, the mass mover assembly moves the reaction counter mass about the Y axis in a second Y rotational direction that is substantially opposite the first Y rotational direction.

The present invention is also directed to an apparatus for transferring an image from an object onto a device. The apparatus includes an illumination system that directs a beam of light energy at the object, a reticle stage assembly that moves the object relative to the device, a wafer stage assembly that moves the device relative to the object, a projection optical assembly positioned between the object and the device, the projection optical assembly, and the adjuster assembly discussed above. The adjuster assembly can be positioned between the object and the device.

The projection optical assembly focuses the projected image from the object. The projection optical assembly includes a projection optical housing and one or more projection optical elements. As provided herein, the adjuster assembly can be positioned within the projection optical assembly. More specifically, the adjuster assembly can be positioned between projection optical elements. With this design, the stage mover assembly also adjusts the position of the adjuster optical element relative to the projection optical housing and the projection optical elements.

The present invention is also directed to a stage assembly that moves an element. The stage assembly includes a stage, a stage mover assembly and a damper assembly. The stage retains the element. The stage mover assembly is coupled to the stage. The stage mover assembly moves the element and generates reaction forces.

The damper assembly is coupled to the stage mover assembly. The damping assembly reduces the reaction forces and disturbances created by the stage mover assembly that are transferred to the rest of the apparatus. As a result thereof, the stage assembly can more accurately position the element. Further, the stage assembly can be used in an exposure apparatus to manufacture high density, high quality semiconductor wafers. The damper assembly includes the reaction counter mass and the mass mover assembly described above. As provided herein, the mass mover assembly moves the reaction counter mass to counteract the reaction forces generated by the stage mover assembly.

As provided herein, the stage mover assembly moves the stage with at least one degree of freedom and more preferably at least two degree of freedom. For example, the stage mover assembly can move the stage about the X axis and/or about the Y axis. In this embodiment, the damping assembly is coupled to the stage mover assembly so that the damping assembly reduces the reaction forces that are transferred to the rest of the apparatus at least about the X axis and/or about the Y axis.

The present invention is also directed to an exposure apparatus, a device made with the exposure apparatus, a wafer made with the exposure apparatus, a method for making an adjuster, a method for making a stage assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
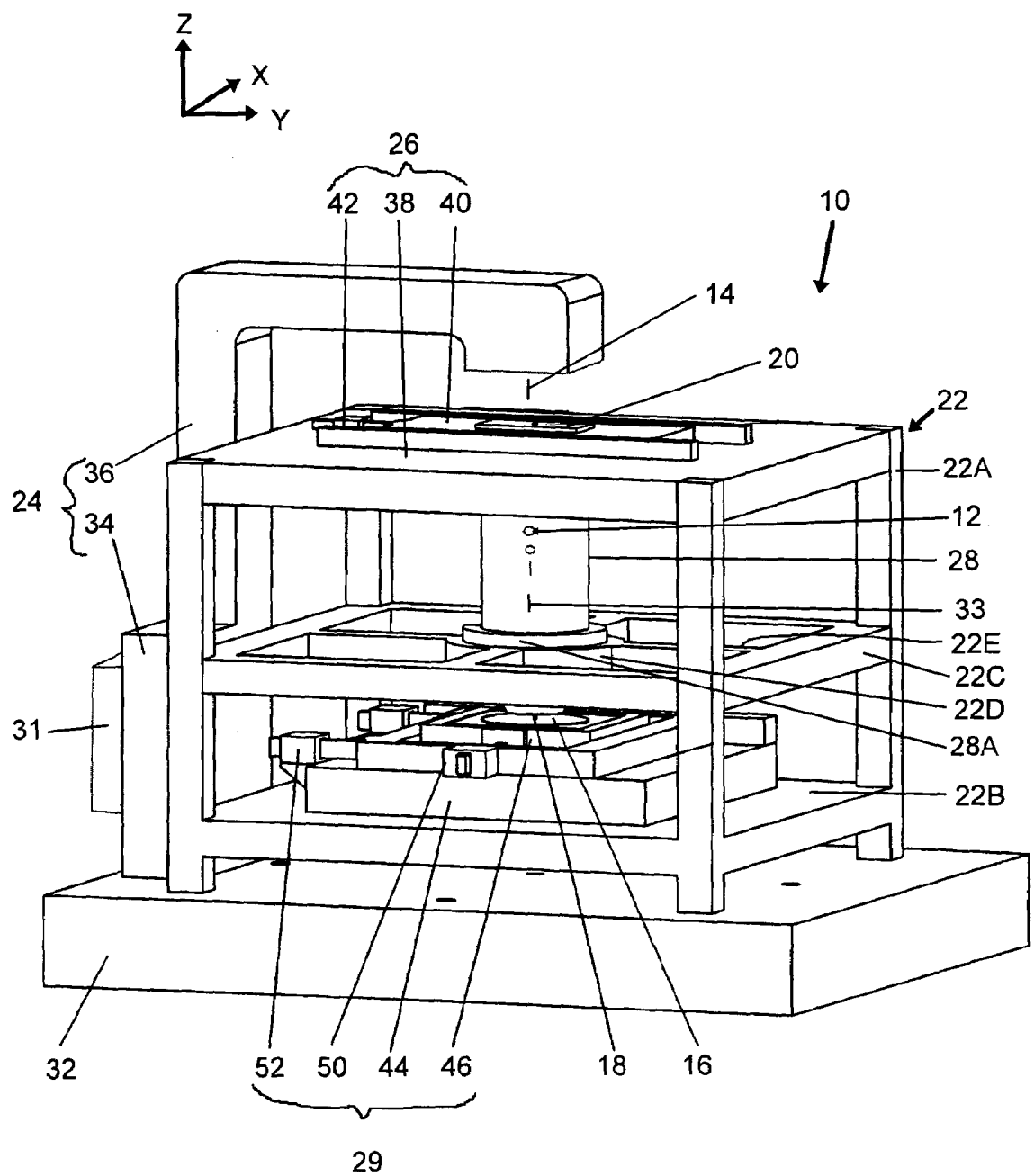
FIG. 1A is a perspective view of an apparatus, including an adjuster assembly having features of the present invention.

Referring initially to FIG. 1A, the present invention is directed to an apparatus 10 including an adjuster assembly 12 (partly illustrated in FIG. 1A) that adjusts a beam of light energy 14 during manufacturing, measuring and/or inspection of a device 16. The type of device 16 manufactured, measured and/or inspected by the apparatus 10 can be varied. For example, the device 16 can be a semiconductor wafer, and the adjuster assembly 12 can be used as part of an exposure apparatus 10 for precisely adjusting where a projected image 18 of an integrated circuit from an object 20 such as a reticle is transferred onto the semiconductor wafer. Alternately, the adjuster assembly 12 can be used to adjust a beam of light energy 14 in another type of apparatus 10.

Some of the Figures provided herein include a coordinate system that designates an X axis, a Y axis that is orthogonal to the X axis, and a Z axis that is orthogonal to the X axis and the Y axis. It should be understood that the coordinate system is merely for reference and can be varied. For example, the Z axis can be switched with the Y axis or the X axis and/or the apparatus 10 can be rotated.

The exposure apparatus 10 illustrated in FIG. 1A includes an apparatus frame 22, an illumination system 24 (irradiation apparatus), a reticle stage assembly 26, a projection optical assembly 28, a wafer stage assembly 29, and a control system 31. The exposure apparatus 10 mounts to a mounting base 32, e.g., the ground, a base, or floor or some other supporting structure.

There are a number of different types of exposure apparatuses 10. For example, the exposure apparatus 10 can be used as scanning type photolithography system that exposes the pattern from the reticle 20 onto the wafer 16 with the reticle 20 and the wafer 16 moving synchronously. In a scanning type lithographic device, the reticle 20 is moved perpendicular to a projection optical axis 33 of the projection optical assembly 28 by the reticle stage assembly 26 and the wafer 16 moved perpendicular to the projection optical axis 33 by the wafer stage assembly 29. Scanning of the reticle 20 and the wafer 16 occurs while the reticle 20 and the wafer 16 are moving synchronously.

Alternately, the exposure apparatus 10 can be a step-and-repeat type photolithography system that exposes the reticle 20 while the reticle 20 and the wafer 16 are stationary. In the step-and-repeat process, the wafer 16 is in a constant position relative to the reticle 20 and the projection optical assembly 28 during the exposure of an individual field. Subsequently, between consecutive exposure steps, the wafer stage assembly 29 consecutively moves the wafer 16 perpendicular to the projection optical axis 33 so that the next field of the wafer 16 is brought into position relative to the projection optical assembly 28 and the reticle 20 for exposure. Following this process, the images on the reticle 20 are sequentially exposed onto the fields of the wafer 16 so that the next field of the wafer 16 is brought into position relative to the projection optical assembly 28 and the reticle 20.

However, the use of the exposure apparatus 10 and the adjuster assembly 12 is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Additionally, the present invention provided herein can be used in other apparatuses, including other semiconductor processing equipment.

The apparatus frame 22 is rigid and supports the components of the exposure apparatus 10. The design of the apparatus frame 22 can be varied to suit the design requirements for the rest of the exposure apparatus 10. The apparatus frame 22 illustrated in FIG. 1A supports the projection optical assembly 28, the illumination system 24, the reticle stage assembly 26, and the wafer stage assembly 29 above the mounting base 32. In this embodiment, the apparatus frame 22 includes (i) four vertical frame legs 22A that are spaced apart and extend vertically from the mounting base 32, (ii) a wafer frame plate 22B that extends horizontally between the vertical frame legs 22A, the wafer frame plate 22B supporting the wafer stage assembly 29, (iii) four horizontal frame legs 22C that cooperate to form a somewhat rectangular shaped frame, each horizontal frame leg 22C extending between adjacent vertical frame legs 22A, (iv) an annular shaped frame 22D that is used to support the projection optical assembly 28, and (v) four horizontal cross ties 22E that extend between and secure the annular shaped frame 22D to the horizontal frame legs 22C.

The apparatus frame 22 can be secured with resilient isolators (not shown) to the mounting base 32. The isolators reduce the effect of vibration of the mounting base 32 causing vibration on the apparatus frame 22. Each isolator can include a pneumatic cylinder (not shown) and an actuator (not shown). Suitable isolators are sold by Technical Manufacturing Corporation, located in Peabody, Mass., or Newport Corporation located in Irvine, Calif.

The illumination system 24 includes an illumination source 34 and an illumination optical assembly 36. The illumination source 34 emits the beam (irradiation) of light energy 14. The illumination source 34 can be g-line (436 nm), i-line (365 nm), KrF excimer laser (248 nm), ArF excimer laser (193 nm) and $F_2$ laser (157 nm).

The illumination optical assembly 36 guides the beam of light energy 14 from the illumination source 34 to the reticle 20. The beam 14 illuminates selectively different portions of the reticle 20 and exposes the semiconductor wafer 16. In FIG. 1A, the illumination source 34 is illustrated as being secured to one of the sides of the apparatus frame 22 and the energy beam 14 from the illumination source 34 is directed to above the reticle 20 with the illumination optical assembly 36.

The reticle stage assembly 26 holds and positions the reticle 20 relative to the projection optical assembly 28 and the wafer 16. The design of the reticle stage assembly 26 can vary to suit the design requirements of the apparatus 10. In the embodiment illustrated in FIG. 1A, the reticle stage assembly 26 includes a reticle stage base 38, a reticle stage 40, and a reticle stage mover assembly 42.

The reticle stage base 38 supports the reticle stage 40 above the mounting base 32. In the embodiment illustrated in FIG. 1A, the reticle stage base 38 is generally rectangular shaped and includes a planar base top (sometimes referred to as a guide face), an opposed planar base bottom (not shown), and four base sides. The reticle stage base 38 is secured to the top of the vertical frame legs 22A. Alternately, the reticle stage base 38 can be secured with resilient isolators (not shown) to the apparatus frame 22.

The reticle stage 40 retains the reticle 20. The reticle stage 40 can include a device holder such as a vacuum chuck, an electrostatic chuck, or some other type of clamp. The reticle stage 40 is somewhat rectangular shaped. A bearing (not shown) maintains the reticle stage 40 spaced apart along the Z axis relative to the reticle stage base 38 and allows for motion of the reticle stage 40 along the X axis, along the Y axis and about the Z axis relative to the reticle stage base 38. Preferably, the bearing is a vacuum preload type fluid bearing that maintains the reticle stage 40 spaced apart from the reticle stage base 38 in a non-contact manner. Alternately, for example, a magnetic type bearing or a ball bearing type assembly could be utilized that allows for motion of the reticle stage 40 relative to the reticle stage base 38.

The reticle stage mover assembly 42 controls and moves the reticle stage 40 relative to the reticle stage base 38. The design of the reticle stage mover assembly 42 and the movement of the reticle stage 40 can be varied to suit the movement requirements of the apparatus 10. In the embodiment illustrated in FIG. 1A, the reticle stage mover assembly 42 moves the reticle stage 40 and the reticle 20 relative to the reticle stage base 38 along the X axis, along the Y axis and about the Z axis. The reticle stage mover assembly 42 can include one or more movers that move the reticle stage 40 relative to the reticle stage base 38. The design of each mover can be varied to suit the movement requirements of the apparatus 10. As provided herein, each of the movers can include one or more rotary motors, voice coil motors, linear motors, electromagnetic actuators, or some other force actuators. Each of the movers of the reticle stage mover assembly 42 is controlled by the control system 31 to precisely position the reticle 20.

Additionally, the reticle stage assembly 26 can include a reticle measurement system (not shown) that monitors the position of the reticle stage 40 and the reticle 20 relative to the projection optical assembly 28 or some other reference. With this information, the control system 31 controls the reticle stage mover assembly 42 to precisely position the reticle stage 40. The design of the reticle measurement system can be varied. For example, the reticle measurement system can utilize laser interferometers, encoders, sensors, and/or other measuring devices. A suitable encoder or interferometer can be made with components obtained from Agilent Technologies in Palo Alto, Calif.

The projection optical assembly 28 projects, directs and/or focuses the beam of light energy 14 passing through the projection optical assembly 28. The design of the projection optical assembly 28 can be varied according to its design requirements. For example, the projection optical assembly 28 can magnify or reduce the image to be illuminated onto the device 16. The projection optical assembly 28 need not be limited to a magnification or a reduction system. The projection optical assembly 28 could also be a 1× system.

In the embodiment illustrated in FIG. 1A, the projection optical assembly 28 includes an annular shaped flange 28A that is used to secure the projection optical assembly 28 of the apparatus frame 22. The projection optical assembly 28 can be secured with resilient isolators (not shown) to the apparatus frame 22. The isolators reduce the effect of vibration of the apparatus frame 22 causing vibration on the projection optical assembly 28. Typically, three or four spaced apart isolators are utilized. Each isolator can include a pneumatic cylinder (not shown) and an actuator (not shown).

The wafer stage assembly 29 holds and positions the wafer 16 with respect to the adjusted projected image of the illuminated portions of the reticle 20. The design of the wafer stage assembly 29 can vary to suit the design requirements of the apparatus 10. In the embodiment illustrated in FIG. 1A, the wafer stage assembly 29 includes a wafer stage base 44, a wafer stage 46, and a wafer stage mover assembly 48.

The wafer stage base 44 supports the wafer stage 46 above the mounting base 32. In the embodiment illustrated in FIG. 1A, the wafer stage base 44 is generally rectangular shaped and includes a planar base top (sometimes referred to as a guide face), an opposed planar base bottom (not shown), and four base sides. The wafer stage base 44 can be secured with resilient isolators (not shown) to the apparatus frame 22.

The wafer stage 46 retains the wafer 16. The wafer stage 46 can include a device holder such as a vacuum chuck, an electrostatic chuck, or some other type of clamp. The wafer stage 46 is somewhat rectangular shaped. A bearing (not shown) maintains the wafer stage 46 spaced apart along the Z axis relative to the wafer stage base 44 and allows for motion of the wafer stage 46 along the X axis, along the Y axis and about the Z axis relative to the wafer stage base 44. Preferably, the bearing is a vacuum preload type fluid bearing that maintains the wafer stage 46 spaced apart from the wafer stage base 44 in a non-contact manner. Alternately, for example, a magnetic type bearing or a ball bearing type assembly could be utilized that allows for motion of the wafer stage 46 relative to the wafer stage base 44.

The wafer stage mover assembly 48 controls and moves the wafer stage 46 relative to the wafer stage base 44. The design of the wafer stage mover assembly 48 and the movement of the wafer stage 46 can be varied to suit the movement requirements of the apparatus 10. In the embodiment illustrated in FIG. 1A, the wafer stage mover assembly 48 moves the wafer stage 46 relative to the wafer stage base 44 along the X axis, along the Y axis and about the Z axis. In this embodiment, the wafer stage mover assembly 48 includes one or more X stage movers 50 and one or more Y stage movers 52. The X stage movers 50 move the wafer stage 46 and the wafer 16 along the X axis, and the Y stage movers 52 move the wafer stage 46 along the Y axis and about the Z axis (theta Z).

The design of each mover 50, 52 can be varied to suit the movement requirements of the apparatus 10. As provided herein, each of the movers 50, 52 can include one or more rotary motors, voice coil motors, linear motors, electromagnetic actuators, or some other force actuators. In the embodiment illustrated in FIG. 1A, each of the movers 50, 52 is a commutated, linear motor. Electrical current (not shown) is individually supplied to each mover 50, 52 by the control system 31 to precisely position the wafer 16.

The wafer stage assembly 30 can include a wafer measurement system (not shown) that monitors the position of the wafer stage 46 relative to the projection optical assembly 28 or some other reference. With this information, the control system 31 can control the wafer stage mover assembly 48 to precisely position the wafer stage 46. The design of the wafer measurement system can be varied. For example, the wafer measurement system can utilize laser interferometers, encoders, sensors, and/or other measuring devices. A suitable encoder or interferometer can be made with components obtained from Agilent Technologies in Palo Alto, Calif.

Further, when linear motors (see U.S. Pat. Nos. 5,623,853 or 5,528,118) are used in the wafer stage assembly 29 or the reticle stage assembly 26, the linear motors can be either an air levitation type employing air bearings or a magnetic levitation type using Lorentz force or reactance force. Additionally, each stage could move along a guide, or it could be a guideless type stage that uses no guide. As far as is permitted, the disclosures in U.S. Pat. Nos. 5,623,853 and 5,528,118 are incorporated herein by reference.

Alternatively, for example, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by each stage motion can be mechanically released to the floor (ground) by use of a frame member as described in U.S. Pat. No. 5,528,118 and published Japanese Patent Application Disclosure No. 8-166475. Additionally, reaction forces generated by each stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

Figure 1B:
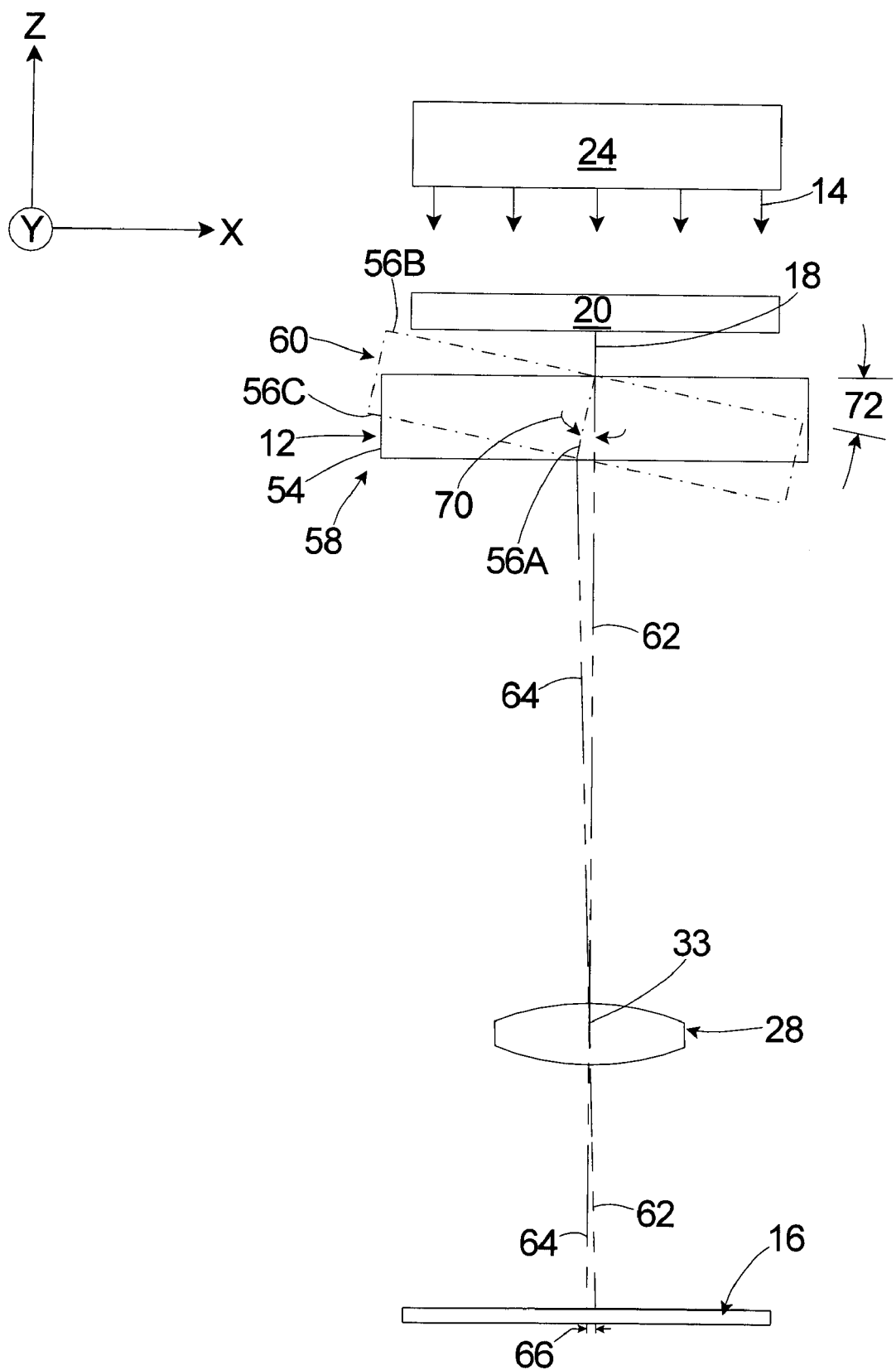
FIG. 1B is a side illustration of one embodiment of how the adjuster assembly adjusts a beam of light energy.

FIG. 1B is a simplified schematic illustration of the illumination system 24, the reticle 20, an adjuster 54 of the adjuster assembly 12, the projection optical assembly 28 including the projection optical axis 33, and the wafer 16. In this embodiment, the adjuster 54 is a single, optical element having an adjuster optical axis 56A, a first surface 56B and an opposed second surface 56C. The adjuster optical axis 56A extends between the first surface 56B and the second surface 56C. In this embodiment, the surfaces 56B, 56C are substantially flat. As illustrated in FIG. 1B, the illumination system 24 directs the beam of light energy 14 (illustrated as arrows) towards the reticle 20. A portion of the beam of light energy 14 passes through the reticle 20 to create the projected image 18 of the integrated circuit that is directed towards adjuster 54, the projection optical assembly 28, and the wafer 20. In FIG. 1B, the projected image 18 initially from the reticle 20 is illustrated as being coaxial with the projection optical axis 33. It should be noted that FIG. 1B actually illustrates only a particular ray of the projected image 18 and how that ray of the projected image 18 moves through the system.

As provided herein, the adjuster assembly 12 selectively adjusts or does not adjust the position where the projected image 18 from the reticle 20 strikes the wafer 16. More specifically, the adjuster assembly 12 adjusts and corrects the projected image 18 in real time to compensate for the misalignment of the projected image on the wafer 16. In the embodiments illustrated herein, the adjuster assembly 12 only shifts where the location where projected image 18 is transferred onto the wafer 16. The adjuster assembly 12 preferably does not distort or alter the shape or characteristics of the projected image 18. Thus, the adjuster assembly 12 can be used to correct alignment errors between the reticle 20 and the wafer 16. This allows for the relieving of the tight tracking tolerances of the reticle stage assembly 26 (illustrated in FIG. 1A) and the wafer stage assembly 29 (illustrated in FIG. 1A).

During operation of the present invention, the adjuster 54 can be moved and/or tilted between a first position 58, a second position 60 (illustrated in phantom) and anywhere therebetween. In both positions 58, 60, the projected image 62 passes through the adjuster 54. In the first position 58, the adjuster 54 does not significantly influence and/or adjust the projected image 18 and a non-adjusted projected image 62 that passes through the adjuster 54 is projected onto the wafer 16 at the same location at which the projected image 18 would have been projected onto the wafer 16. In FIG. 1B, the non-adjusted projected image 62 is illustrated as being coaxial with the projection optical axis 33 and the projected image 18. In the second position 60, the adjuster 54 significantly influences and/or adjusts the projected image 18, and an adjusted projected image 64 that passes through the adjuster 54 is projected onto the wafer 16 at a different location than which the projected image 18 would have been projected onto the wafer 16. In one embodiment, in the second position 60, the adjuster assembly 12 shifts the projected image 18 and does not distort or alter the shape or characteristics of the projected image 18.

Stated another way, in the first position 58, the non-adjusted projected image 62 is transferred onto the wafer 16 at the same location that the projected image 18 would be transferred onto the wafer 16 if the exposure apparatus 10 did not include the adjuster assembly 12. In the second position 56, the adjusted projected image 64 is shifted or offset 66 at the wafer 16 from non-adjusted projected image 62.

It should be noted in FIG. 1B, that the amount of difference between the positions 58, 60 is exaggerated and the projection optical assembly 28 is illustrated as a thin lens approximation of how the projection optical assembly 28 will influence the non-adjusted projected image 62 or the adjusted projected image 64.

The location and design of the adjuster assembly 12 can be varied. For example, the adjuster 54 can be located almost anywhere directly between the object 20 and the device 16. It is believed that better image quality is achieved by positioning the adjuster 54 near the object 20 or near the device 16. With this design, the adjuster assembly 12 is able to shift the projected image 18 without distorting and/or blurring the projected image 18. However, other distances from the object 20 or device 16 can be utilized. In FIG. 1B, the adjuster assembly 12 is illustrated as being positioned directly below the reticle 20, between the reticle 20 and the projection optical assembly 28. However, depending upon the design of the projection optical assembly 28, the adjuster assembly 12 can be positioned in other locations. For example, because of the compact designs and reaction assemblies provided herein, a portion of the adjuster assembly 12 can be integrated directly into the projection optical assembly 28.

It should also be noted that the adjusted projected image 64 is illustrated in FIG. 1B as being coaxial with the adjuster optical axis 56A. However, the adjusted projected image 64 does not follow the adjuster optical axis 56A. Instead, the angle (beta) that the projected image 18 is altered by the adjuster 54 depends upon a number of factors, including the optical index of the fluid near the adjuster 54, the optical index of the adjuster 54, the thickness of the adjuster 54, and the angle (theta) that the projected image 18 strikes the adjuster 54. According to Snell's Law, the sine of theta times the optical index of the fluid near the adjuster 54 is equal to the sine of beta times the optical index of the adjuster 54.

Thus, the amount in which the adjuster assembly 12 is able to shift and/or offset 66 the adjusted projected image 64 from the non-adjusted projected image 62 at the device 16 can be varied according to the needs of the apparatus 10 to correct alignment errors. For example, for a quartz adjuster 54 that is approximately 0.5 inches thick, a potential shift or potential offset 66 at the device 16 of between approximately zero and 50 nanometers, or alternately between approximately zero and 5 microns is suitable for many exposure apparatuses 10. However, greater than these amounts of shifts are possible.

In the first position 58, if the opposed surfaces 56B, 56C of the adjuster 54 are substantially flat, the adjuster 54 is maintained so that the opposed surfaces 56B, 56C are substantially perpendicular to the projection optical axis 33, the adjuster optical axis 56A is substantially coaxial with the projection optical axis 33 and the adjuster optical axis 56A is substantially perpendicular to the wafer 16 and reticle 20. With this design, in the first position 58, the adjuster 54 does not influence the projected image 18.

In the second position 60, if the opposed surfaces 56B, 56C of the adjuster 54 are substantially flat, the adjuster 54 is moved and/or tilted so that the opposed surfaces 56B, 56C are not perpendicular to the projection optical axis 33, the adjuster optical axis 56A is not substantially coaxial with the projection optical axis 33 and the adjuster optical axis 56A is not perpendicular to the wafer 16 and reticle 20. With this design, in the second position 60, the adjuster 54 adjusts the actual projected image 18.

The amount in which the adjuster 54 is moved between the positions 58, 60 can be varied, for example, to suit the design requirements of the adjuster assembly 12, the required amount of optical adjustment of the projected image 18, the material used in the adjuster 54, the thickness of the adjuster 54, and the design of the projection optical assembly 28.

For example, for a quartz adjuster 54 that is approximately 0.5 inches thick, the adjuster 54 can be tilted (i) about the Y axis so that the angle 70 between the adjuster optical axis 56A and the projection optical axis 33 is between approximately zero and 50 microradians, or alternately between approximately zero and 5 milliradians, and (ii) about the X axis so that the angle (not shown) between the adjuster optical axis 56A and the projection optical axis 33 is between approximately zero and 50 microradians, or alternately between approximately zero and 5 milliradians. Stated another way, for example, the adjuster 54 can be tilted so that an angle 72 between the first surface 56B in the first position 58 and the first surface 56B in the second position 60 is between approximately zero and 50 microradians, or alternately between approximately zero and 5 milliradians. However, greater than these amounts of tilt of the adjuster 54 are possible.

Figure 2A:
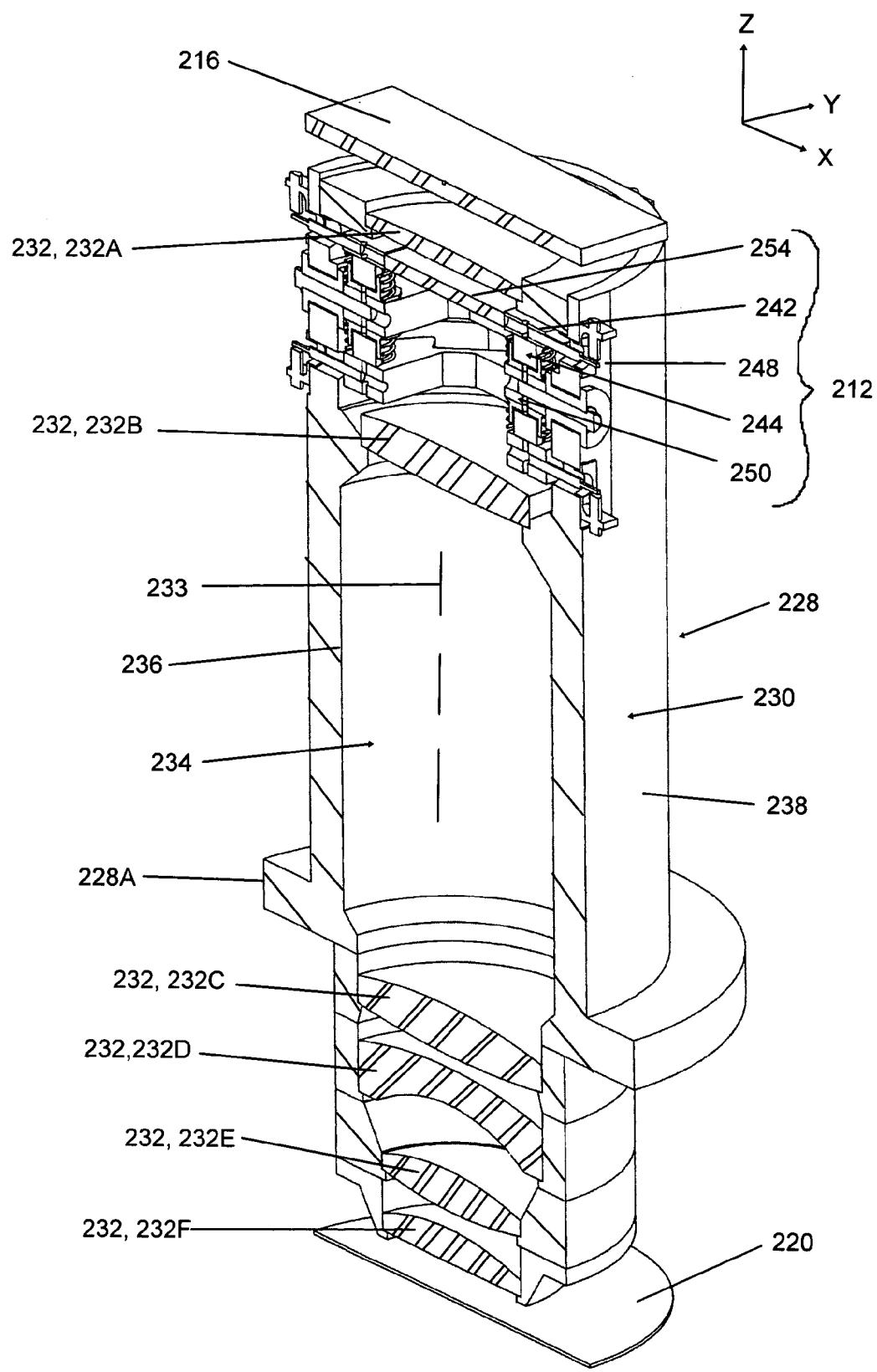
FIG. 2A is a cut-away view of an object, an adjuster assembly, a projection optical assembly, and a device having features of the present invention.

A number of designs of the projection optical assembly and the adjuster assembly and are provided herein. For example, FIGS. 2A–2D illustrate one embodiment of the projection optical assembly 228 and the adjuster assembly 212. The projection optical assembly 228 and the adjuster assembly 212 can be utilized in the apparatus 10 of FIG. 1A. FIG. 2A also illustrate a portion of the wafer 216 and a portion of the reticle 220.

Referring initially to FIG. 2A, in this embodiment, the projection optical assembly 228 includes a projection optical housing 230 and one or more projection optical elements 232 that are secured to the projection optical housing 230.

The projection optical housing 230 and the projection optical elements 232 can combine to define one or more sealed cavities 234. In FIG. 2A, the projection optical housing 230 is substantially tubular or annular shaped and each cavity 234 is substantially right, cylindrical shaped and has a circular shaped cross-section, although other shapes are also possible. The projection optical housing 230 includes an inner wall 236 and an outer wall 238. The outer wall 238 includes the annular shaped flange 228A for securing the projection optical assembly 228 to the apparatus frame 22 (illustrated in FIG. 1A).

The number of projection optical elements 232 utilized and the design of each projection optical element 232 can be varied to suit the requirements of the projection optical assembly 228. In FIG. 2A, the projection optical assembly 228 includes six, spaced apart, projection optical elements 232 that are positioned within the projection optical housing 230. For convenience, these projection optical elements 232 are designated from top to bottom as (i) a first outer optical element 232A, (ii) a first intermediate optical element 232B, (iii) a second intermediate optical element 232C, (iv) a third intermediate optical element 232D, (v) a fourth intermediate optical element 232E, and (vi) a second outer optical element 232F. These projection optical elements 232 can be positioned within and sealed to the projection optical housing 230. Each projection optical element 232 is typically generally disk shaped and is made of a ground or molded piece of substantially transparent material such as glass or plastic. Each projection optical element 232 includes opposed surfaces, either or both of which are curved so that the light rays converge or diverge. Further, each projection optical element 232 can be a lens, a refractive mirror, or a prism.

With respect to the projection optical assembly 228, when far ultra-violet rays such as the excimer laser is used in the apparatus 10 (illustrated in FIG. 1A), glass materials such as quartz and fluorite that transmit far ultra-violet rays is preferable to be used for the projection optical elements 232. When the $F_2$ type laser is used, the projection optical assembly 228 should preferably be either catadioptric or refractive (a reticle should also preferably be a reflective type), and when an electron beam is used, electron optics should preferably consist of electron lenses and deflectors.

The projection optical assembly 228 can include one or more fluid exchange ports (not shown) that extend through the projection optical housing 230 for providing a desired controlled environment within the projection optical assembly 228. The desired environment in the projection optical assembly 228 varies accordingly to the type of apparatus 10. For example, the desired controlled environment can be an inert gas such as Argon, Helium, or Nitrogen. Alternately, for example, the controlled environment can be a vacuum, some other fluid or some other environment. However, the projection optical assembly 228 can operate without a controlled environment.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

In FIG. 2A, the adjuster assembly 212 is positioned within and is secured to the projection optical housing 230 between the first outer optical element 232A and the first intermediate optical element 232B. Further, in this embodiment, the adjuster assembly 212 includes the adjuster 254 having the adjuster axis 256A, an adjuster stage 242, an adjuster stage mover assembly 244, an adjuster measurement system 248, and a damper assembly 250.

Figure 2B:
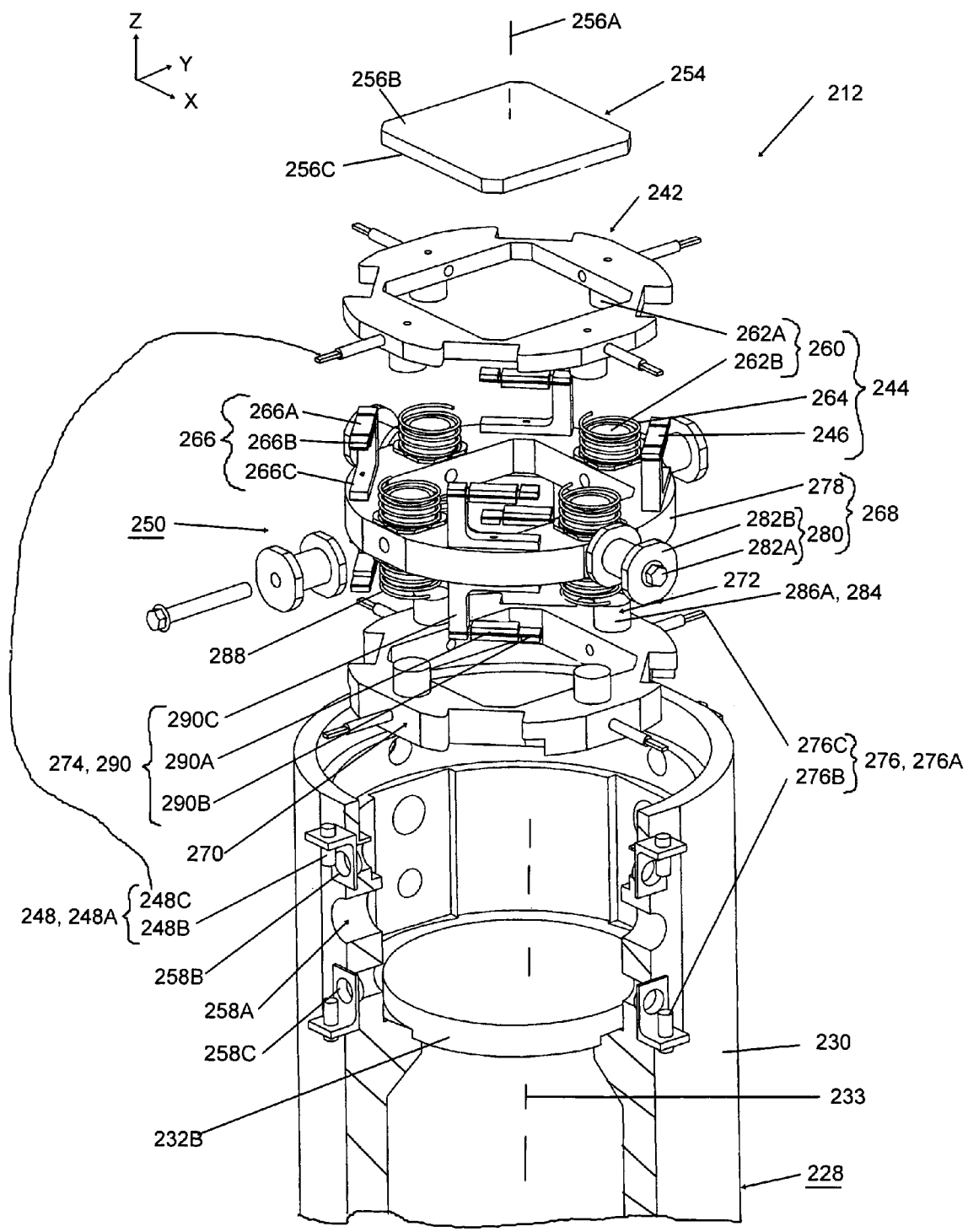
FIG. 2B is an exploded perspective view of the adjuster assembly and a portion of the projection optical assembly of FIG. 2A.

FIG. 2B illustrates a partly cut-away, perspective view of the projection optical assembly 228, and a top, partly exploded perspective view of the adjuster assembly 212 of FIG. 2A. Only a portion of the projection optical housing 230, the first intermediate optical element 232B and the projection optical axis 233 of the projection optical assembly 228 are illustrated in FIG. 2B. In this embodiment, the projection optical assembly 228 includes (i) four housing apertures 258A that are spaced apart around and extend radially through the projection optical housing 230, the housing apertures 258 being used to secure the adjuster assembly 212 to the projection optical housing 230, (ii) four spaced apart upper bar apertures 258B that are spaced apart around and extend radially through the projection optical housing 230, and (iii) four spaced apart lower bar apertures 258C that are spaced apart and extend radially through the projection optical housing 230.

In this embodiment, the adjuster 254 is a single, optical element made of a ground and polished or a molded piece of substantially transparent material such as glass or plastic. The adjuster 254 is generally flat plate shaped and includes the upper, first surface 256B, and the opposed second surface 256C. Either or both surfaces 256B, 256C are substantially planar and are positioned substantially perpendicular to the adjuster optical axis 256A. Stated another way, the adjuster optical axis 256A extends normal to the opposed surfaces 256B, 256C. However, other shapes of the adjuster 254 are possible and either or both opposed surfaces 256B, 256C can be slightly curved so that the light rays converge or diverge. The adjuster 254 can be a lens, a refractive mirror, or a prism. Alternately, for example, the adjuster 254 can include multiple lens or elements that move concurrently. Movement of the adjuster 254 can result in shifting of the image along two axes.

With respect to the adjuster assembly 212, when far ultra-violet rays such as an excimer laser is used in the apparatus 10 (illustrated in FIG. 1A), glass materials such as quartz and fluorite that transmit far ultra-violet rays is preferable to be used for the adjuster 254. When the $F_2$ type laser or x-ray is used, the adjuster 254 should preferably be either catadioptric or refractive (a reticle should also preferably be a reflective type), and when an electron beam is used, electron optics should preferably consist of electron lenses and deflectors.

The adjuster stage 242 retains the adjuster 254. In the embodiment illustrated in FIG. 2B, the adjuster stage 242 is somewhat annular shaped and defines a square shaped opening for receiving the adjuster 254. An adhesive or clamp, for example, can be used to secure the adjuster 254 to the adjuster stage 242.

The adjuster stage mover assembly 244, under the control of the control system 31 (illustrated in FIG. 1A), precisely moves the adjuster stage 242 and the adjuster 254 between the positions 54, 56 (illustrated in FIG. 1B) relative to the rest of the exposure apparatus 10 (illustrated in FIG. 1A), including for example, the projection optical assembly 228, the device 216 (illustrated in FIG. 2A), and the object 220 (illustrated in FIG. 2A). In this embodiment, the adjuster stage mover assembly 244 is connected and engages the adjuster stage 242. Alternately, for example, the adjuster stage mover assembly 244 can be connected directly to the adjuster 254 and the adjuster stage 242 could be eliminated.

In the first position 54, if the opposed surfaces 256B, 256C of the adjuster 254 are substantially flat, the adjuster stage mover assembly 244 maintains the adjuster 254 so that the opposed surfaces 256B, 256C are substantially perpendicular to the projection optical axis 233 and the adjuster axis 256A is substantially coaxial with the projection optical axis 233. With this design, in the first position 54, the adjuster 254 does not influence the actual projected image. It should be noted that the adjuster 254 can be moved and/or vibrated along the X axis, along the Y axis, along the Z axis and about the Z axis while maintaining the opposed surfaces 256B, 256C substantially perpendicular to the projection optical axis 233 and the adjuster optical axis 256A substantially coaxial with the projection optical axis 233. Stated another way, movement of the adjuster 254 along the X axis, along the Y axis, along the Z axis and about the Z axis does not influence the actual projected image 18 (illustrated in FIG. 1B).

In the second position 56, if the opposed surfaces 256B, 256C of the adjuster 254 are substantially flat, the adjuster stage mover assembly 244 moves the adjuster 254 so that the opposed surfaces 256B, 25C are not perpendicular to the projection optical axis 233 and the adjuster optical axis 256A is not substantially coaxial with the projection optical axis 233. It should be noted that the adjuster stage mover assembly 244 can move the adjuster 254 about the X axis and/or about the Y axis to tilt the adjuster 254 so that the opposed surfaces 256B, 256C are not perpendicular to the projection optical axis 233 and the adjuster optical axis 256A is not substantially coaxial with the projection optical axis 233. With this design, in the second position 56, the adjuster 254 adjusts the actual projected image.

The amount in which the adjuster stage mover assembly 244 moves the adjuster 254 between the positions 54, 56 can be varied to suit the design requirements of the adjuster assembly 212 and the required amount of optical adjustment of the projected image 18. For example, the adjuster stage mover assembly 244 can tilt the adjuster 254 about the X axis and about the Y axis between approximately zero and 50 microradians, or alternately between approximately zero and 5 milliradians. However, greater than these amounts of tilt of the adjuster 254 can be utilized.

The design of the adjuster stage mover assembly 244 can be varied. In the embodiment illustrated in FIG. 2B, the adjuster stage mover assembly 244 moves the adjuster 254 relative to the projection optical housing 258 with two degrees of freedom, namely about the X axis and about the Y axis. Alternately, for example, the adjuster stage mover assembly 244 can move the adjuster 254 relative to the projection optical housing 258 with three degrees of freedom or six degrees of freedom.

In FIG. 2B, the adjuster stage mover assembly 244 includes four spaced, apart stage movers 260. The design of each stage mover 260 can be varied. Each of the stage movers 260 can include one or more rotary motors, voice coil motors, linear motors, electromagnetic actuators, or some other force actuators. In FIG. 2B, each of the stage movers 260 is a non-commutated, linear motor, commonly referred to as a voice coil motor. As provided herein, each of the stage movers 260 includes (i) a first component 262A that is secured to the adjuster stage 242 or the adjuster 254 and (ii) an adjacent second component 262B that interacts with the first component 262A, the second component 262B is secured and coupled to the damper assembly 250.

For each stage mover 260, one of the components 262A, 262B includes one or more magnets and the other component 262B, 262A includes one or more conductors. Electrical current (not shown) is individually supplied to each conductor by the control system 31 (illustrated in FIG. 1A). For each stage mover 260, the electrical current in each conductor interacts with a magnetic field (not shown) generated by one or more of the magnets. This causes a force (Lorentz force) between the conductors and the magnets. The required stroke of each stage movers 260 can vary. It is anticipated that the required stroke of each stage movers 260 is between approximately 0.0001 inches and 0.0003 inches. However, larger or smaller strokes can be utilized.

In this embodiment, the first component 262A of each stage movers 260 includes a right cylindrical shaped magnet, while the second component 262B of each stage movers 260 includes an annular shaped conductor that encircles the magnet. With this design, the stage movers 260 can cooperate to make corrections to the positions of the adjuster 254 about the X axis and/or the about the Y axis and maintain the position of the adjuster 254 along the Z axis. Alternately, for example, the first component of each stage movers 260 could include one or more conductors while the second component could include one or more magnets.

Additionally, the adjuster stage mover assembly 244 can include one or more adjuster supports 264 that extend between the adjuster stage 242 and the damping assembly 250. The adjuster supports 264 are utilized to support the dead weight of the adjuster 254, inhibit overheating of the stage movers 260, and inhibit heat buildup within the projection optical assembly 228. As provided herein, one adjuster support 264 can be preferably positioned next to each stage movers 260. Each adjuster support 264 has very low stiffness in all degrees of freedom so they do not significantly interfere with the control of the adjuster 254. For example, each adjuster support 264 can be a spring or a fluid bellow. In FIG. 2B, each adjuster support 264 is a spring that encircles one of the stage movers 260.

Additionally, the adjuster stage mover assembly 244 can include an adjuster guide 246 that guides the movement of the adjuster 254 relative to the damper assembly 250. The design of the adjuster guide 246 can be varied. As provided herein, the adjuster guide 246 allows for movement of the adjuster 254 about the X axis and about the Y axis relative to the damper assembly 250 and inhibits movement of the adjuster 254 along the X axis, along the Y axis and about the Z axis relative to the damper assembly 250. In this embodiment, the adjuster guide 246 includes four spaced apart adjuster connectors 266 that extend between the adjuster stage 242 and the damper assembly 250. In FIG. 2B, each of the adjuster connectors 266 includes (i) a flexure 266A, (ii) an adjuster guide mount 266B that secures one end of the flexure 266A to the adjuster stage 242, and (iii) an "L" shaped reaction guide mount 266C that secures the other end of the flexure 266A to the damper assembly 250. Each flexure 266A is a flat, flexible piece of material, having a relatively high stiffness in some directions and relatively low stiffness in other directions. In this embodiment, the flexures 266A cooperate to have (i) a relatively high stiffness along the X axis, along the Y axis and about the Z axis and (ii) are relatively flexible along the Z axis, about the X axis and about the Y. The ratio of relatively high stiffness to relatively low stiffness is at least approximately 100/1, and can be at least approximately 1000/1. Each flexure 266A, for example, can be a flat leaf spring.

Alternately, for example, the adjuster guide 246 can include one or more actuators, such as attraction only actuators, that guide the movement of the adjuster 254.

The adjuster measurement system 248 monitors the position of the adjuster 254 relative to the rest of the projection optical assembly 228 or some other reference. For example, the adjuster measurement system 248 can monitor the position of the adjuster 254 about the X axis and about the Y axis. With this information, the adjuster stage mover assembly 244 can be used to precisely position the adjuster 254. The design of the adjuster measurement system 248 can be varied. For example, the adjuster measurement system 248 can utilize laser interferometers, encoders, sensors, and/or other measuring devices. Suitable encoders and interferometers can be made with components obtained from Agilent Technologies in Palo Alto, Calif.

In the embodiment illustrated in FIG. 2B, the adjuster measurement system 248 includes four spaced apart measurement assemblies 248A. Each of the measurement assemblies 248A includes a sensor 248B that is secured to the outer wall of the projection optical housing 230 and a sensor rod 248C that cantilevers radially away from the adjuster stage 242 through one of the upper bar apertures 258B in the projection optical housing 230. With this design, the sensor 248B of each of the measurement assembly 248A can monitor relative motion of the sensor rod 248C.

The damper assembly 250 reduces and minimizes the amount of reaction forces and disturbances from the adjuster stage mover assembly 244 that are transferred to the projection optical assembly 228 and the rest of the exposure apparatus 10. This improves the focusing and locating of the projection optical assembly 228 and the performance of the exposure apparatus 10. The design of the damper assembly 250 can be varied to suit the design requirements of the adjuster assembly 212. In the embodiment illustrated in FIG. 2B, the damper assembly 250 includes a reaction frame assembly 268, a reaction counter mass 270, a mass mover assembly 272, a reaction guide 274 and a reaction measurement system 276.

The reaction frame assembly 268 supports and retains a portion of the adjuster stage mover assembly 244 and a portion of the mass mover assembly 272. The design of the reaction frame assembly 268 can vary. In the embodiment illustrated in FIG. 2B, the reaction frame assembly 268 includes a reaction frame 278, and one or more reaction mounts 280 secure the reaction frame 278 to the projection optical housing 230. FIG. 2B, the reaction frame 278 is annular shaped and is shaped somewhat similar to the adjuster stage 242. The reaction frame 278 defines a rectangular shaped inner aperture that allows the adjusted projected image to pass through the reaction frame 278. The second component 262B of each stage mover 260 is secured to an upper surface of the reaction frame 278.

The reaction mounts 280 secure the reaction frame 278 to the projection optical housing 230. The embodiment illustrated in FIG. 2B includes four spaced apart reaction mounts 280. Each reaction mount 280 includes a fastener 282A and a mount damper 282B. Each fastener 282A extends through one of the housing apertures 258A in the projection optical housing 230 and each fastener 282A includes an externally threaded surface that engages a corresponding internally threaded surface in the reaction frame 278 to secure the reaction frame 278 to the projection optical housing 230.

The mount damper 282B is somewhat spool or hub shaped, fits over the fastener 282A, and is positioned between the fastener 282 and the projection optical housing 230. The mount damper 282B reduces and minimizes the magnitude of reaction forces and disturbances from the mover assemblies 244, 272 that are transferred from the reaction frame 278 to the projection optical assembly 228. Each mount damper 282B can be made of a resilient material such as SWEDAC DG-U6, sold by Kuriyama Corp., located at 12-14, Nishinakajima 1-Chome, Yodogawa-ku, Osaka 532-0011, Japan.

The design of the reaction counter mass 270 can be varied according to the design of the rest of the adjuster assembly 212. In FIG. 2B, the reaction counter mass 270 is annular shaped and is shaped somewhat similar to the adjuster stage 242. The reaction counter mass 270 defines a rectangular shaped inner aperture that allows the adjusted projected image to pass through the reaction counter mass 270 without interfering with the adjusted projected image. For ease of design, the ratio of the mass of the reaction counter mass 270 to the mass of the combination of the adjuster 254 and the adjuster stage 242 is approximately 1:1. However, the ratio of the mass of the reaction counter mass 270 to the mass of the combination of the adjuster 254 and the adjuster stage 242 can be greater than or less than approximately 1:1. The amount of movement of the reaction counter mass 270 will vary according to the design of the adjuster assembly 212, the movement of the adjuster 254 and the ratio of the mass of the reaction counter mass 270 to the combination of the adjuster 254 and the adjuster stage 242. In the embodiments illustrated herein, the reaction counter mass 270 is designed to move between approximately zero and 50 microradians, or alternately between approximately zero and 5 milliradians about the X axis and about the Y axis.

The mass mover assembly 272 positions and moves the reaction counter mass 270 relative to the projection optical housing 230 and the rest of the apparatus 10. The design of the mass mover assembly 272 and the movement of the reaction counter mass 270 can be varied to suit the adjustment requirements of the apparatus 10. In the embodiment illustrated in FIG. 2B, the mass mover assembly 272 moves the reaction counter mass 270 relative to the projection optical housing 230 with two degrees of freedom, namely about the X axis and about the Y axis. Alternately, for example, the mass mover assembly 272 can move the reaction counter mass 270 relative to the projection optical housing 230 with three degrees of freedom or six degrees of freedom.

In the embodiment illustrated in FIG. 2B, the mass mover assembly 272 includes four spaced apart, mass movers 284. The design of each mass mover 284 can be varied. As provided herein, each of the mass movers 284 can include one or more rotary motors, voice coil motors, linear motors, electromagnetic actuators, or some other force actuators. In FIG. 2B, each of the mass movers 284 is a non-commutated, linear motor, commonly referred to as a voice coil motor. As provided herein, each of the mass movers 284 includes (i) a first component 286A that is secured to the top of the reaction counter mass 270 and (ii) an adjacent second component 286B (illustrated in FIG. 2B) that interacts with the first component 286A, the second component 286B being secured and coupled to the bottom of the reaction frame 278.

For each mass mover 284, one of the components 286A, 286B includes one or more magnets and the other component 286B, 286A includes one or more conductors. Electrical current (not shown) is individually supplied to each conductor in each conductor array by the control system 31. For each mass mover 284, the electrical current in each conductor interacts with a magnetic field (not shown) generated by one or more of the magnets. This causes a force (Lorentz force) between the conductors and the magnets. The required stroke of each mass mover 284 can vary. It is anticipated that the required stroke of each mass mover 284 is between approximately 0.0001 inches and 0.0003 inches. However, larger or smaller strokes may be utilized.

In this embodiment, the first component 286A of each mass mover 284 includes a right cylindrical shaped magnet, while the second component 286B of each mass mover 284 includes an annular shaped conductor that encircles the magnet. With this design, the mass movers 284 can cooperate to make corrections to the positions of the reaction counter mass 270 about the X axis and the about the Y axis and maintain the position of the reaction counter mass 270 along the Z axis. Alternately, for example, the first component of each mass mover 284 could include one or more conductor arrays while the second component could include a magnet array.

Additionally, the mass mover assembly 272 can include one or more mass supports 288 that extend between the reaction counter mass 270 and the reaction frame 278. The mass supports 288 are utilized to support the dead weight of the reaction counter mass 270, inhibit overheating of the mass movers 284, and inhibit heat buildup within the projection optical assembly 228. As provided herein, one mass support 288 can be positioned next to each mass mover 284. Each mass support 288 has very low stiffness in all degrees of freedom so they do not significantly interfere with the control of the reaction counter mass 270. For example, each mass support 288 can be a spring or a fluid bellow. In FIG. 2B, each mass support 288 is a spring that encircles one of the mass movers 284.

The reaction guide 274 guides the movement of the reaction counter mass 270 relative to the reaction frame 278. The design of the reaction guide 274 can be varied. In FIG. 2B, the reaction guide 274 allows for movement of the reaction counter mass 270 about the X axis and about the Y axis relative to the reaction frame 278 and inhibits movement of the reaction counter mass 270 along the X axis, along the Y axis and about the Z axis relative to the reaction frame 278. Further, in this embodiment, the reaction guide 274 includes a plurality of spaced apart reaction connectors 290 that extend between the reaction counter mass 270 and the reaction frame 278. In FIG. 2B, each of the reaction connectors 290 includes (i) a flexure 290A, (ii) a mass guide mount 290C that secures one end of the flexure 290A to the counter mass 270, and (iii) an "L" shaped reaction guide mount 290C that secures the other end of the flexure 290A to the reaction frame 278. Each flexure 290A is a flat, flexible piece of material, having a relatively high stiffness in some directions and relatively low stiffness in other directions. In this embodiment, the flexures 290A (i) cooperate to have a relatively high stiffness along the X axis, along the Y axis and about the Z axis and (ii) are relatively flexible along the Z axis, about the X axis and about the Y. The ratio of relatively high stiffness to relatively low stiffness is at least approximately 100/1, and can be at least approximately 1000/1. Each flexure 290A, for example, can be a flat leaf spring.

Alternately, for example, the reaction guide 274 can include one or more actuators, such as attraction only actuators, that guide the movement of the reaction counter mass 270.

The reaction measurement system 276 monitors the position of the reaction counter mass 270 relative to the rest of the projection optical assembly 228 or some other reference. For example, the reaction measurement system 276 can monitor the position of the reaction counter mass 270 about the X axis, about the Y axis and along the Z axis. With this information, the mass mover assembly 272 can be used to precisely position the reaction counter mass 270. The design of the reaction measurement system 276 can be varied. For example, the reaction measurement system 276 can utilize laser interferometers, encoders, sensors, and/or other measuring devices. A suitable encoder or interferometer can be made with components obtained from Agilent Technologies in Palo Alto, Calif.

In FIG. 2B, the adjuster measurement system 248 includes four spaced apart measurement assemblies 276A. Each of the measurement assemblies 276A includes a sensor 276B that is secured to the outer wall of the projection optical housing 230 and a sensor rod 276C that cantilevers radially away from the reaction counter mass 220 through one of the lower sensor apertures 258C in the projection optical housing 230. With this design, the sensor 276B of each of the measurement assembly 276A can monitor relative motion of the sensor rod 276C.

Figure 2C:
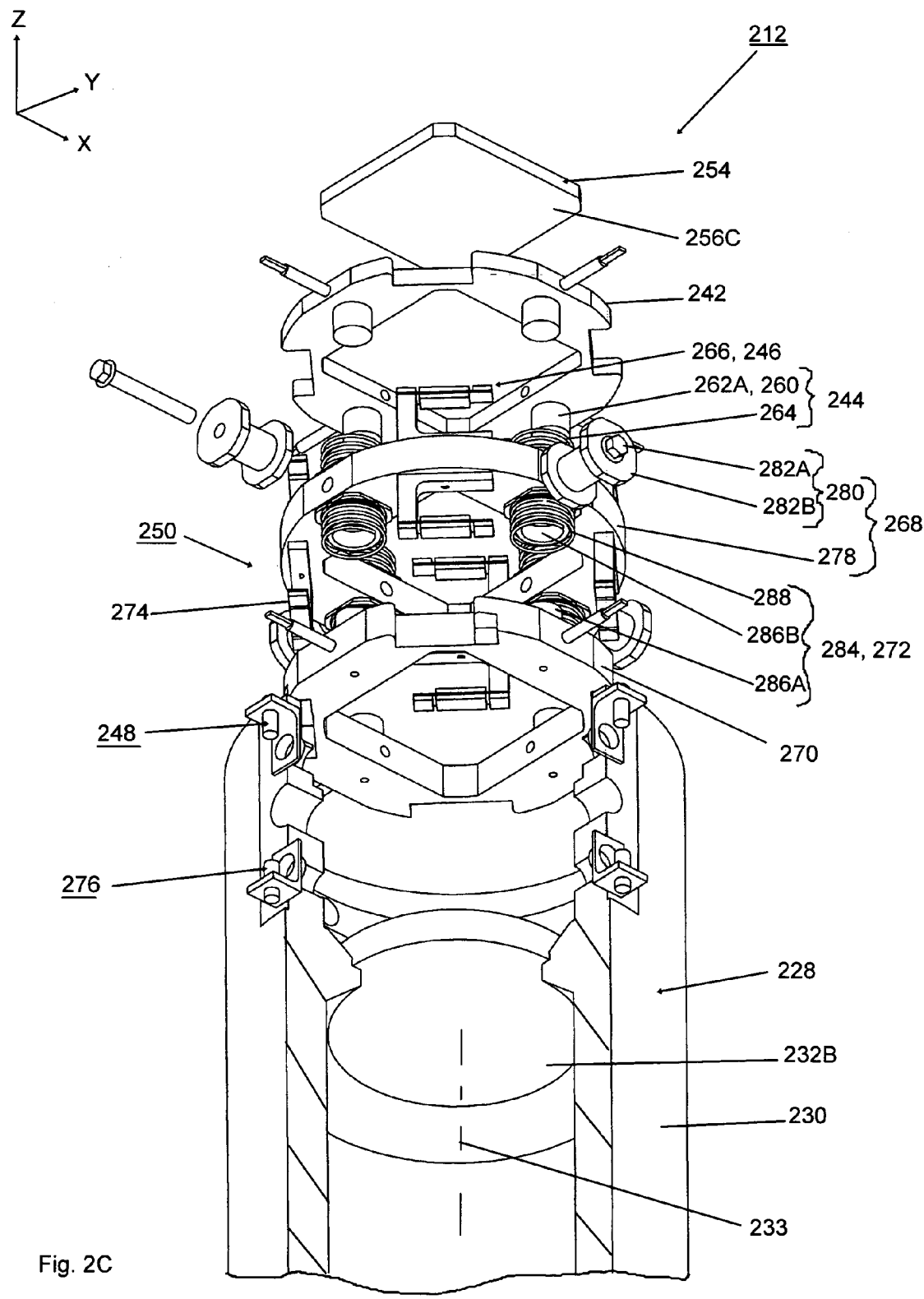
FIG. 2C is another exploded perspective view of the adjuster assembly and a portion of the projection optical assembly of FIG. 2A.

FIG. 2C illustrates a partly cut-away perspective view of a portion of the projection optical assembly 228, and a bottom, partly exploded perspective view of the adjuster assembly 212 of FIGS. 2A and 2B. Only a portion of the projection optical housing 230, the first intermediate optical element 232B and the projection optical axis 233 of the projection optical assembly 228 are illustrated in FIG. 2C.

For the adjuster assembly 212, FIG. 2C illustrates (i) the second surface 256C of the adjuster 254, (ii) the adjuster stage 242, (iii) the adjuster stage mover assembly 244 including the first components 262A of the stage movers 260 and the adjuster supports 264, (iv) the adjuster connectors 266 of the adjuster guide 246, (v) the adjuster measurement system 248, and (vi) the damper assembly 250 including (a) the reaction frame assembly 268 having the reaction frame 278 and the reaction mounts 280 including the fastener 282A and the mount damper 282B, (b) the reaction counter mass 270, (c) the mass mover assembly 272 including the components 286A, 286B of the mass movers 284 and the mass supports 288, (d) the reaction guide 274, and (e) the reaction measurement system 276.

Figure 2D:
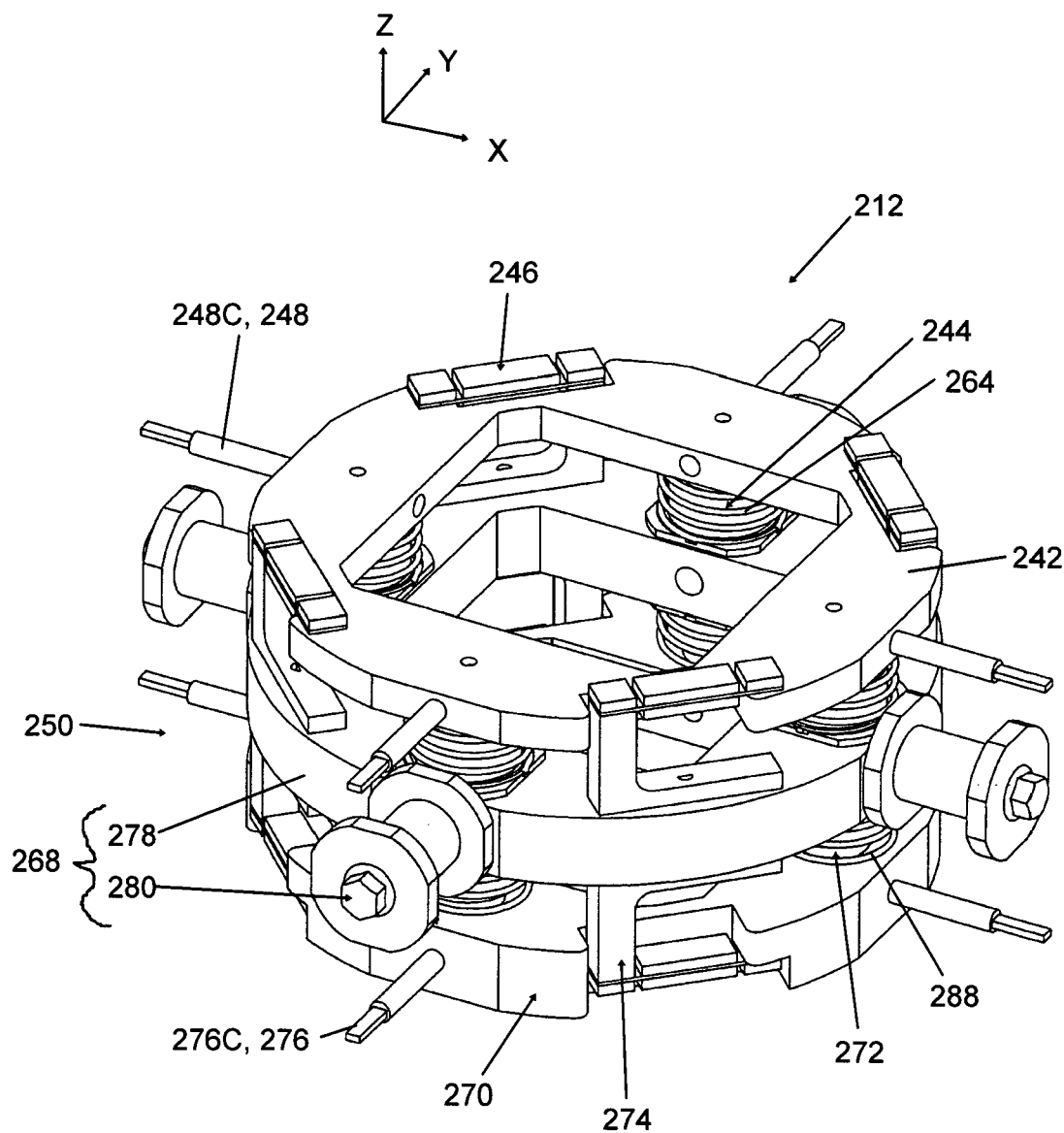
FIG. 2D is a perspective view of the adjuster assembly of FIG. 2A.

FIG. 2D illustrates a perspective view of the adjuster assembly 212 of FIGS. 2A–2C without the adjuster. For the adjuster assembly 212, FIG. 2D illustrates (i) the adjuster stage 242, (ii) the adjuster stage mover assembly 244 including the adjuster supports 264, (iii) the adjuster guide 246, (iv) the sensor rods 248C of the adjuster measurement system 248, and the (v) the damper assembly 250 including (a) the reaction frame assembly 268 having the reaction frame 278 and the reaction mounts 280, (b) the reaction counter mass 270, (c) the mass mover assembly 272 including the mass supports 288, (d) the reaction guide 274, and (e) the sensor rods 276C of the reaction measurement system 276.

In operation, in the embodiment illustrated in FIGS. 2A–2D, the control system 31 (illustrated in FIG. 1A)

directs current to the adjuster stage mover assembly 244 so that the adjuster stage mover assembly 244 applies an adjuster force to the adjuster 254 about the X axis and/or about the Y axis to move and/or tilt the adjuster 254 so that the adjusted projected image 64 (illustrated 1B) is directed at the proper location on the device 16. Substantially simultaneously, the control system 31 directs current to the mass mover assembly 272 so that the mass mover assembly 272 applies a reaction force to the reaction counter mass 270 about the X axis and/or about the Y axis to move and/or tilt the reaction counter mass 270.

Stated another way, wherein when the adjuster stage mover assembly 244 moves the adjuster 254 about the X axis in a first X rotational direction, the mass mover assembly 272 moves the reaction counter mass 270 about the X axis in a second X rotational direction that is substantially opposite the first X rotational direction. Similarly, when the adjuster stage mover assembly 244 moves the adjuster 254 about the Y axis in a first Y rotational direction, the mass mover assembly 272 moves the reaction counter mass 270 about the Y axis in a second Y rotational direction that is substantially opposite the first Y rotational direction.

As provided herein, the reaction force applied by the mass mover assembly 272 to the reaction counter mass 270 is at least approximately eighty percent, and more preferably at least approximately ninety percent, and even more preferably substantially equal in magnitude and opposite in direction to the adjuster force applied by the adjuster stage mover assembly 244 to the adjuster 254. With this design, the reaction force negates and cancels the adjuster force at the reaction frame 278. This reduces and minimizes the amount of reaction forces and disturbances from the adjuster stage mover assembly 244 that are transferred to the projection optical housing 230 and the projection optical elements 232. Stated another way, the control system 31 controls current to the adjuster stage mover assembly 244 and the mass mover assembly 272 so that the absolute value of the ratio of the reaction force applied by the mass mover assembly 272 to the adjuster force applied by the adjuster stage mover assembly 244 is at least approximately 1:1. However, other ratios are possible.

Disturbances can cause the reaction counter mass 270 to become incorrectly positioned. Thus, the mass mover assembly 272 can also be used to make minor corrections to the position of the reaction counter mass 270 so that the reaction counter mass 270 does not drift away and so that the reaction counter mass 270 is correctly positioned during operation of the adjuster assembly 212.

It should be noted that the adjuster stage 242, the reaction frame 278, and the reaction counter mass 270 can be made of a number of materials including ceramics, such as alumina or silicon carbide; metals such as aluminum; composite materials; or plastic. Preferably, these components are made of a substantially non-conductive material so that the adjuster assembly 212 is somewhat electrically isolated from the rest of the apparatus 10.

Further, with the teachings provided herein, the stage mover assembly 244 and the damper assembly 250 illustrated in FIGS. 2A–2D can be incorporated in the reticle stage assembly 26 (illustrated in FIG. 1A). The resulting reticle stage assembly 26 could move the reticle 20 with six degrees of freedom, namely along the X, Y, and Z axes and about the X, Y, and Z axes and dampen vibration along the Z axis, and about the X and Y axes. Somewhat similarly, with the teachings provided herein, the stage mover assembly 244 and the damper assembly 250 illustrated in FIGS. 2A–2D can be incorporated in the wafer stage assembly 29 (illustrated in FIG. 1A). The resulting wafer stage assembly 29 could move the wafer 16 with six degrees of freedom, namely along the X, Y, and Z axes and about the X, Y, and Z axes and dampen vibration along the Z axis and about the X and Y axes.

Figure 3A:
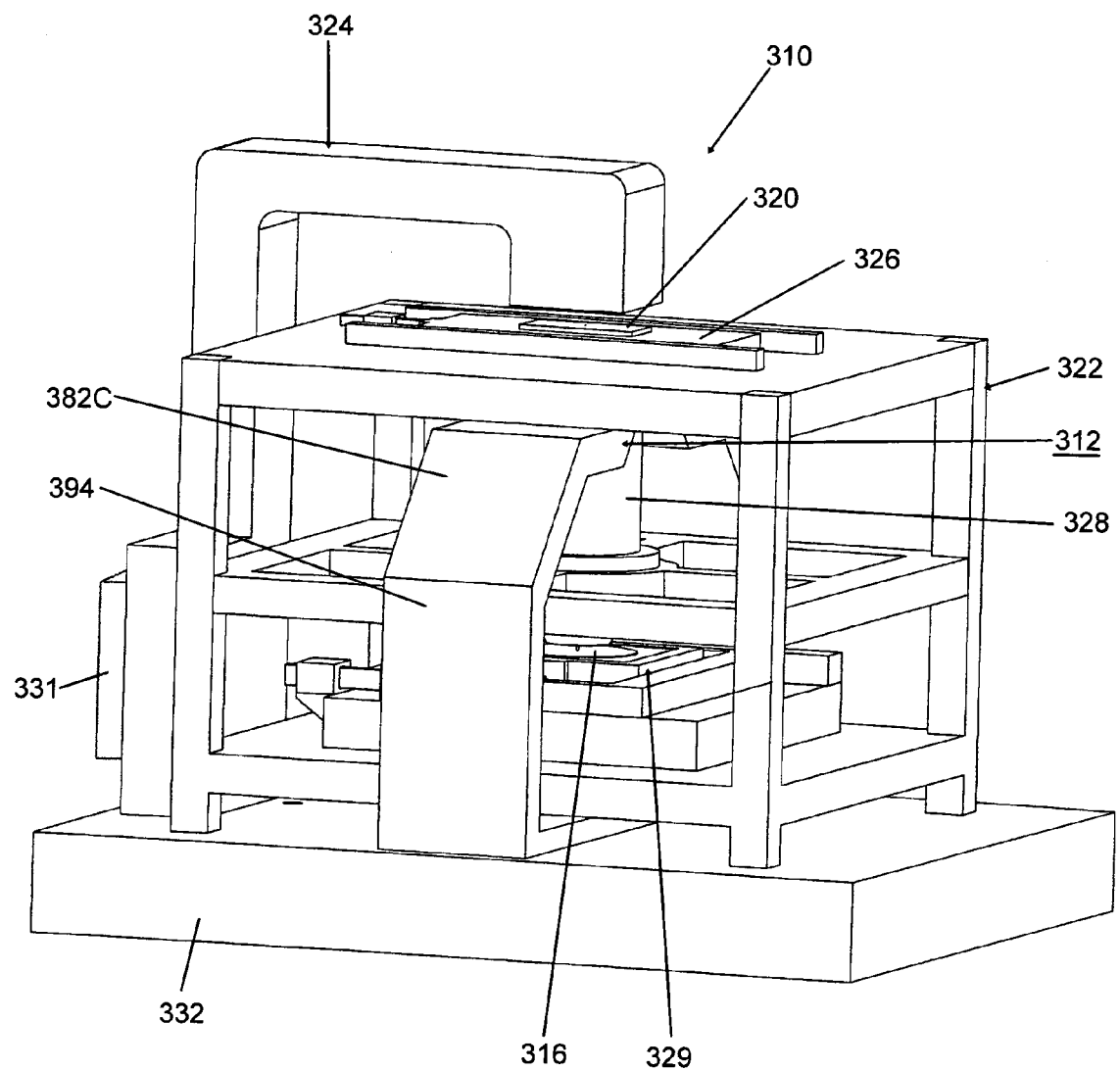
FIG. 3A is a perspective view of another embodiment of the apparatus, including the adjuster assembly having features of the present invention.

FIG. 3A illustrates another embodiment of an exposure apparatus 310 having features of the present invention. The apparatus 310 includes an apparatus frame 322, an illumination system 324 (irradiation apparatus), an reticle stage assembly 326, a projection optical assembly 328, a wafer stage assembly 329, a control system 331 and an adjuster assembly 312. The apparatus 310, for example, can be used as a photolithography system that exposes a pattern from a reticle 320 onto a wafer 316. The apparatus frame 322, the illumination system 324, the reticle stage assembly 326, the projection optical assembly 328, the wafer stage assembly 329, and the control system 331 are similar to the corresponding components described above and illustrated in FIG. 1A. However, the adjuster assembly 312 is slightly different from the adjuster assembly 12 described above. More specifically, the adjuster assembly 312 includes a base reaction frame 382C that transfers reaction forces from the adjuster assembly 312 to mounting base 332. Stated another way, in this embodiment, the adjuster assembly 312 is coupled via the base reaction frame 382C to the mounting base 332 instead of the projection optical assembly 328.

Figure 3B:
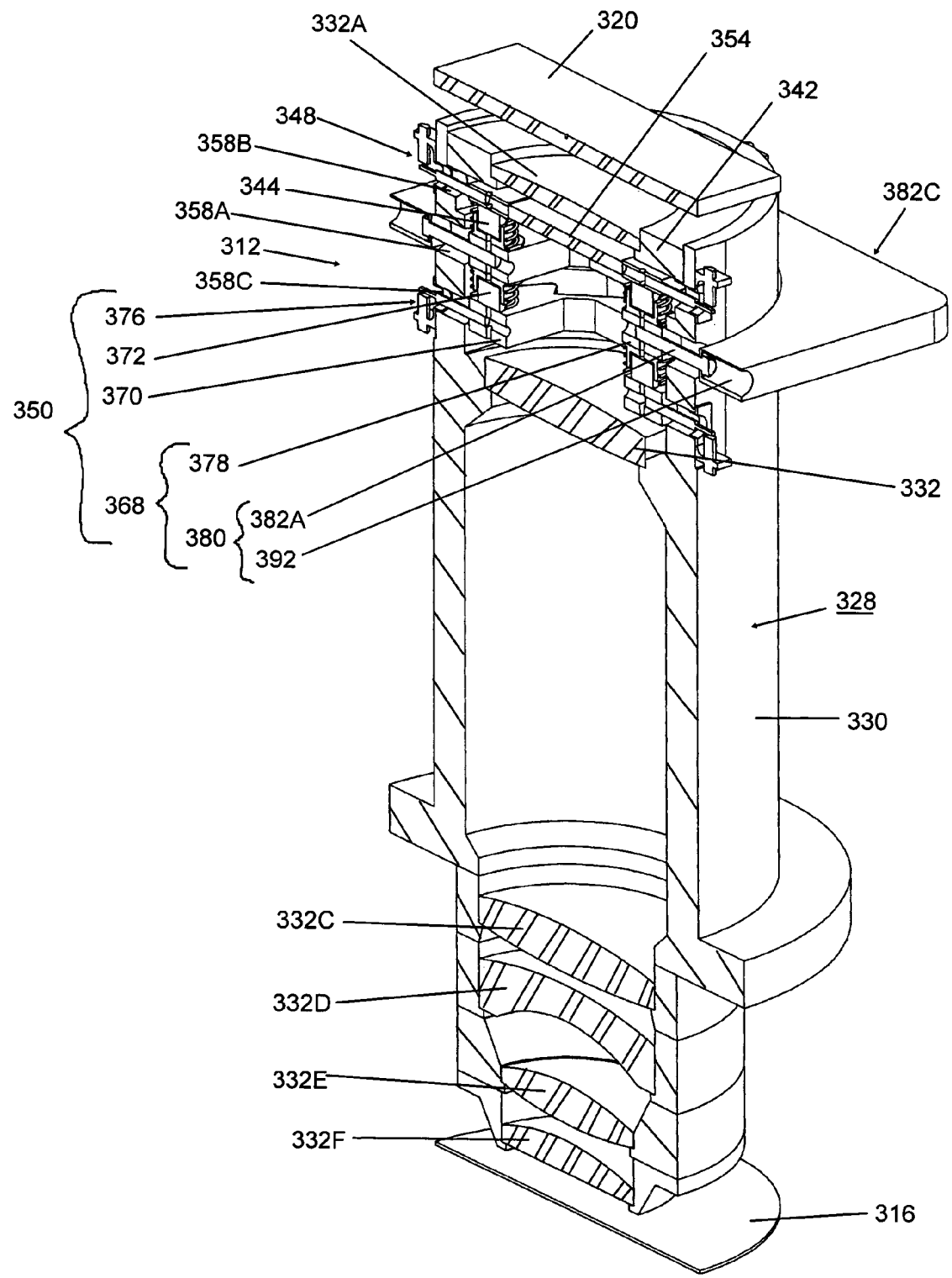
FIG. 3B is a cut-away view of the object, the device, the projection optical assembly and another embodiment of an adjuster assembly having features of the present invention.

FIGS. 3B–3E illustrate this embodiment of the adjuster assembly 312 in more detail. More specifically, FIG. 3B illustrates the adjuster assembly 312, the projection optical assembly 328, the wafer 316 and the reticle 320. In this embodiment, the projection optical assembly 328 is similar to the projection optical assembly 228 illustrated in FIG. 2A and discussed above. The projection optical assembly 328 includes the projection optical housing 330, the projection optical elements 332A–332F that are secured to the projection optical housing 330, the housing apertures 358A, and the bar apertures 358B, 358C.

The adjuster assembly 312 is somewhat similar to the adjuster assembly 212 illustrated in FIG. 2A and described above. More specifically, most of the adjuster assembly 312 is positioned completely within the projection optical housing 330 between the first outer optical element 332A and the first intermediate optical element 332B. Further, in this embodiment, the adjuster assembly 312 includes an adjuster 354, an adjuster stage 342, an adjuster stage mover assembly 344, an adjuster guide 346 (illustrated in FIG. 3C), an adjuster measurement system 348 that are similar to the corresponding components described above and illustrated in FIG. 2A. However, a damper assembly 350 of the adjuster assembly 312 is slightly different from the damper assembly 250 described above and illustrated in FIG. 2A.

In FIG. 3B, the damper assembly 350 includes a reaction counter mass 370, a mass mover assembly 372, a reaction guide 374 (illustrated in FIG. 3C) and a reaction measurement system 376 that are similar to the corresponding components described above and illustrated in FIG. 2A.

However, a reaction frame assembly 368 of the damper assembly 350 is slightly different from the reaction frame assembly 268 described above and illustrated in FIG. 2A. More specifically, in FIG. 3B, the reaction frame assembly 368 is secured to the mounting base 332 (illustrated in FIG. 3A) instead of the projection optical housing 330. The reaction frame assembly 368 includes a reaction frame 378, and a reaction mount 380 including the base reaction frame 382C. The reaction frame 378 is similar to the reaction frame 278 described above.

The reaction mount 380 secures the reaction frame 378 to the mounting base 332. In FIG. 3B, the reaction mount 380 includes four spaced apart fasteners 382A that extend through the housing apertures 358A in the projection optical housing 330. Each fastener 382A includes an externally threaded surface that engages a corresponding internally threaded surface in the reaction frame 378 to secure the reaction frame 378 to the base reaction frame 382C.

The base reaction frame 382C is coupled directly to the mounting base 332 (illustrated in FIG. 3A) and transfers reaction forces from the mover assemblies 344, 372 directly to the mounting base 332. This reduces and minimizes the amount of reaction forces and disturbances from the mover assemblies 344, 372 that are transferred to the projection optical assembly 328. Alternately, for example, the base reaction frame 382C could be coupled directly to the apparatus frame 322 (illustrated in FIG. 3A).

The design of the base reaction frame 382C can be varied to suit the design requirements of the apparatus 310. In the embodiment illustrated in FIGS. 3A and 3B, the base reaction frame 382C is rigid and includes a first base frame 392 and a second base frame 394. The first base frame 392 is somewhat rectangular plate shaped and includes a large opening so that the first base frame 392 encircles the projection optical housing 330. The fasteners 382A secure the reaction frame 378 to the first base frame 392. The second base frame 394 includes one or more leg sections that extend between the first base frame 392 and the mounting base 332 and secure the first base frame 392 to the mounting base 332. In this embodiment, each leg section is somewhat "C" shaped.

It should be noted that in this embodiment, because the base reaction frame 382C transfers reaction forces and disturbances from the mover assemblies 344, 372 to the mounting base 332, the damping assembly 350 can alternately be designed to not include the reaction counter mass 370, the mass mover assembly 372 and the reaction guide 374.

Figure 3C:
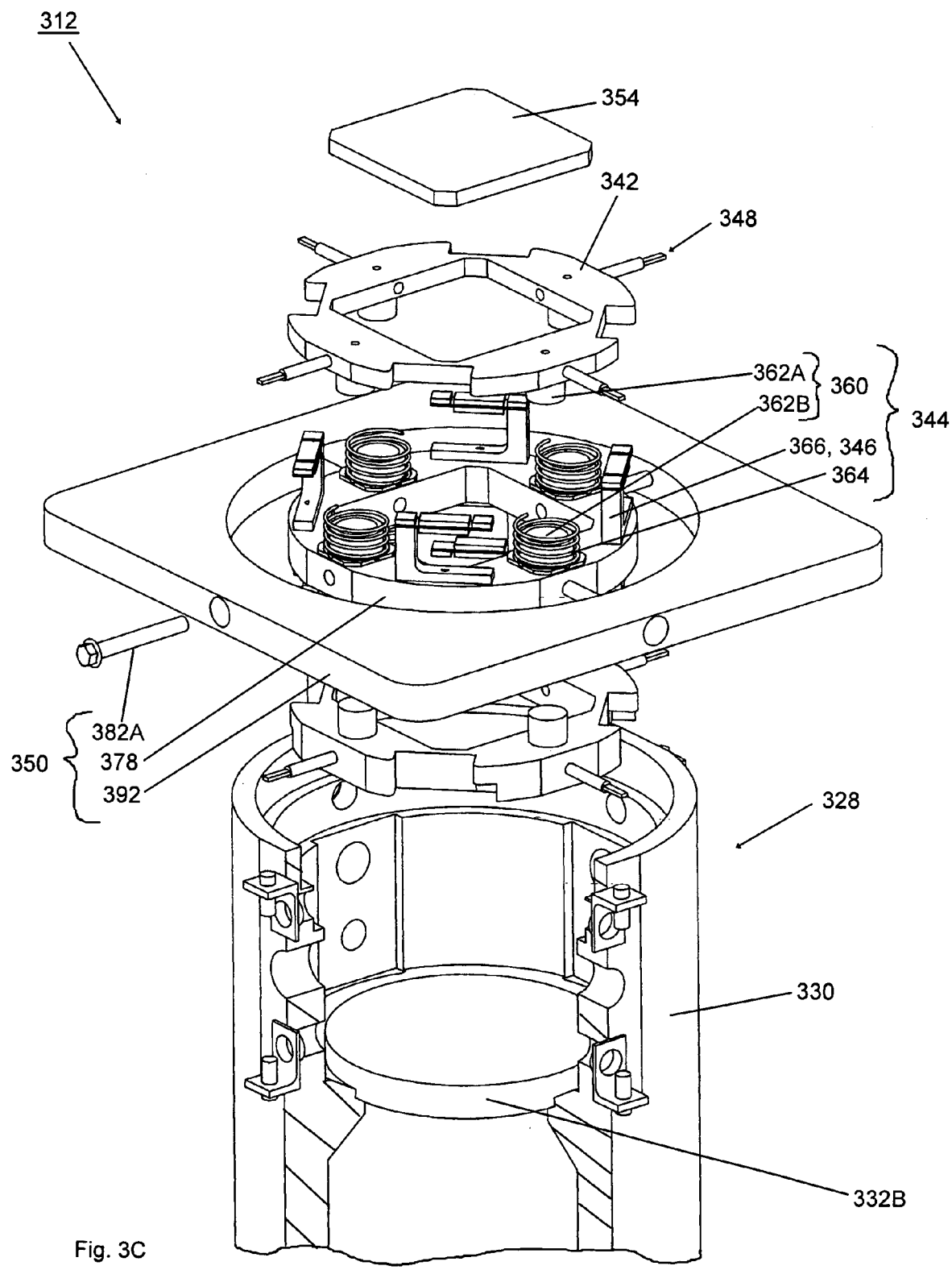
FIG. 3C is an exploded perspective view of the adjuster assembly and a portion of the projection optical assembly of FIG. 3B.

FIG. 3C illustrates a partly cut-away perspective view of a portion of the projection optical assembly 328, and a top, partly exploded perspective view of the adjuster assembly 312 of FIGS. 3A and 3B. Only a portion of the projection optical housing 330 and the first intermediate optical element 332B of the projection optical assembly 328 are illustrated in FIG. 3C.

For the adjuster assembly 312, FIG. 3C illustrates (i) the adjuster 354, (ii) the adjuster stage 342, (iii) the adjuster stage mover assembly 344 including the components 362A, 362B of the stage movers 360 and the adjuster supports 364, (iv) the adjuster connectors 366 of the adjuster guide 346, (v) the adjuster measurement system 348, and (vi) the reaction assembly 350 including the reaction frame 378, the fasteners 382A and the first base frame 392.

Figure 3D:
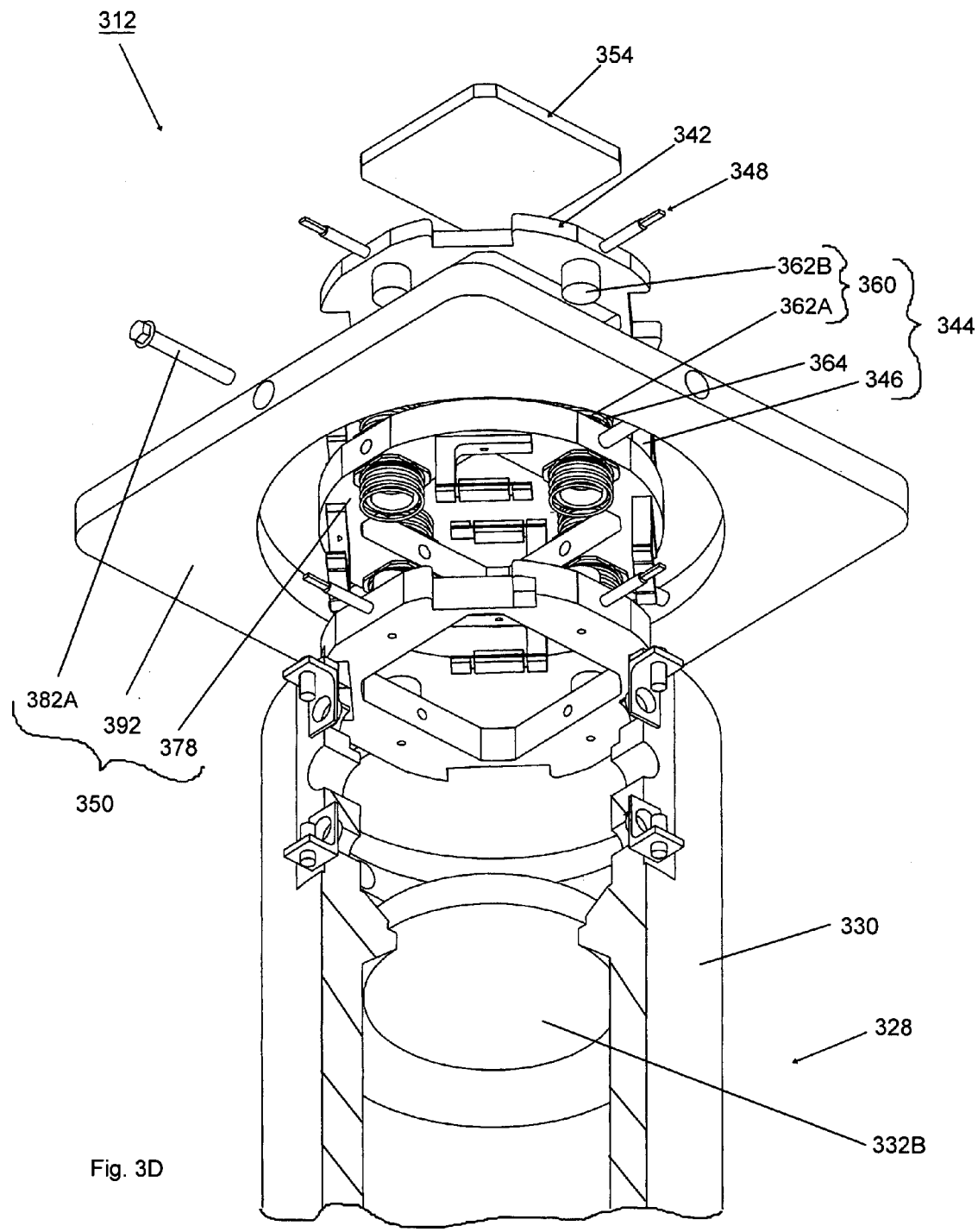
FIG. 3D is another exploded perspective view of the adjuster assembly and a portion of the projection optical assembly of FIG. 3B.

FIG. 3D illustrates a partly cut-away perspective view of a portion of the projection optical assembly 328, and a bottom, partly exploded perspective view of the adjuster assembly 312 of FIGS. 3A and 3B. Only a portion of the projection optical housing 330, and the first intermediate optical element 332B of the projection optical assembly 328 are illustrated in FIG. 3D.

For the adjuster assembly 312, FIG. 3D illustrates (i) the adjuster 354, (ii) the adjuster stage 342, (iii) the adjuster stage mover assembly 344 including the components 362A, 362B of the stage movers 360 and the adjuster supports 364, (iv) the adjuster guide 346, (v) the adjuster measurement system 348, and (vi) the reaction assembly 350 including the reaction frame 378, the fasteners 382A and the first base frame 392.

Figure 3E:
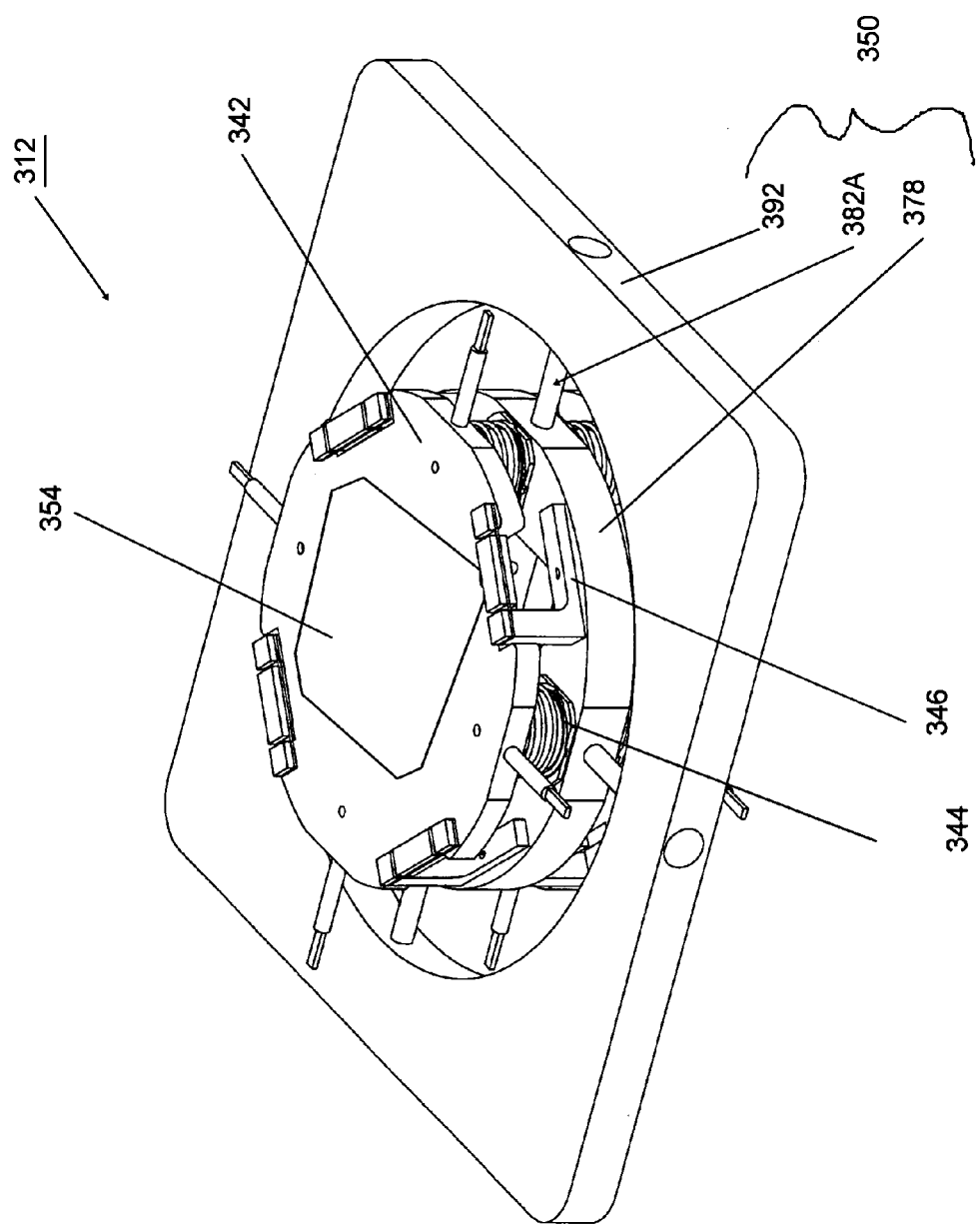
FIG. 3E is a perspective view of the adjuster assembly of FIG. 3B.

FIG. 3E illustrates a top perspective view of the adjuster assembly 312 of FIGS. 3A and 3B. For the adjuster assembly 312, FIG. 3E illustrates (i) the adjuster 354, (ii) the adjuster stage 342, (iii) the adjuster stage mover assembly 344, (iv) the adjuster guide 346, and (v) the reaction assembly 350 including the reaction frame 378, the fasteners 382A and the first base frame 392.

In the embodiment illustrated in FIGS. 3A–3E, the control system 331 directs current to the adjuster stage mover assembly 344 so that the adjuster stage mover assembly 344 applies an adjuster force to the adjuster 354 about the X axis and/or about the Y axis to move and/or tilt the adjuster 354. Substantially simultaneously, the control system 331 directs current to the mass mover assembly 372 so that the mass mover assembly 372 applies a reaction force to the reaction counter mass 370 about the X axis and/or about the Y axis to move and/or tilt the reaction counter mass 370.

Further, with the teachings provided herein, the stage mover assembly 344 and the reaction assembly 350 illustrated in FIGS. 3A–3E can be incorporated in the reticle stage assembly 326 (illustrated in FIG. 3A). The resulting reticle stage assembly 326 could move the reticle 320 with six degrees of freedom, namely along the X, Y, and Z axes and about the X, Y, and Z axes and transfer vibration along the Z axis and about the X and Y axes. Somewhat similarly, with the teachings provided herein, the stage mover assembly 344 and the damper assembly 350 illustrated in FIGS. 3A–3E can be incorporated in the wafer stage assembly 329 (illustrated in FIG. 3A). The resulting wafer stage assembly 329 could move the wafer 316 with six degrees of freedom, namely along the X, Y, and Z axes and about the X, Y, and Z axes and dampen vibration along the Z axis and about the X and Y axes.

Figure 4A:
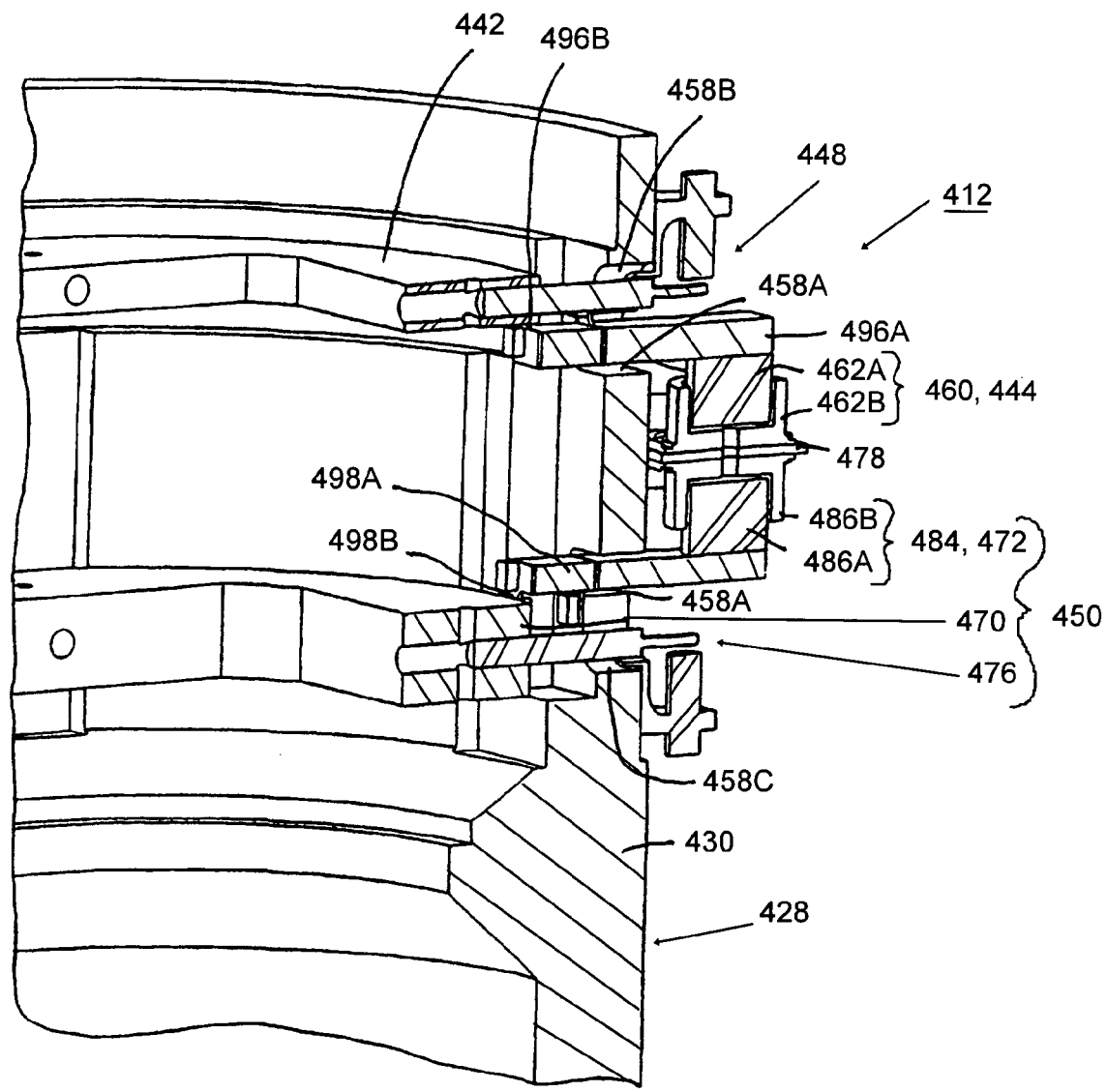
FIG. 4A is a cut-away view of a portion of yet another embodiment of an adjuster assembly and a projection optical assembly having features of the present invention.
Figure 4B:
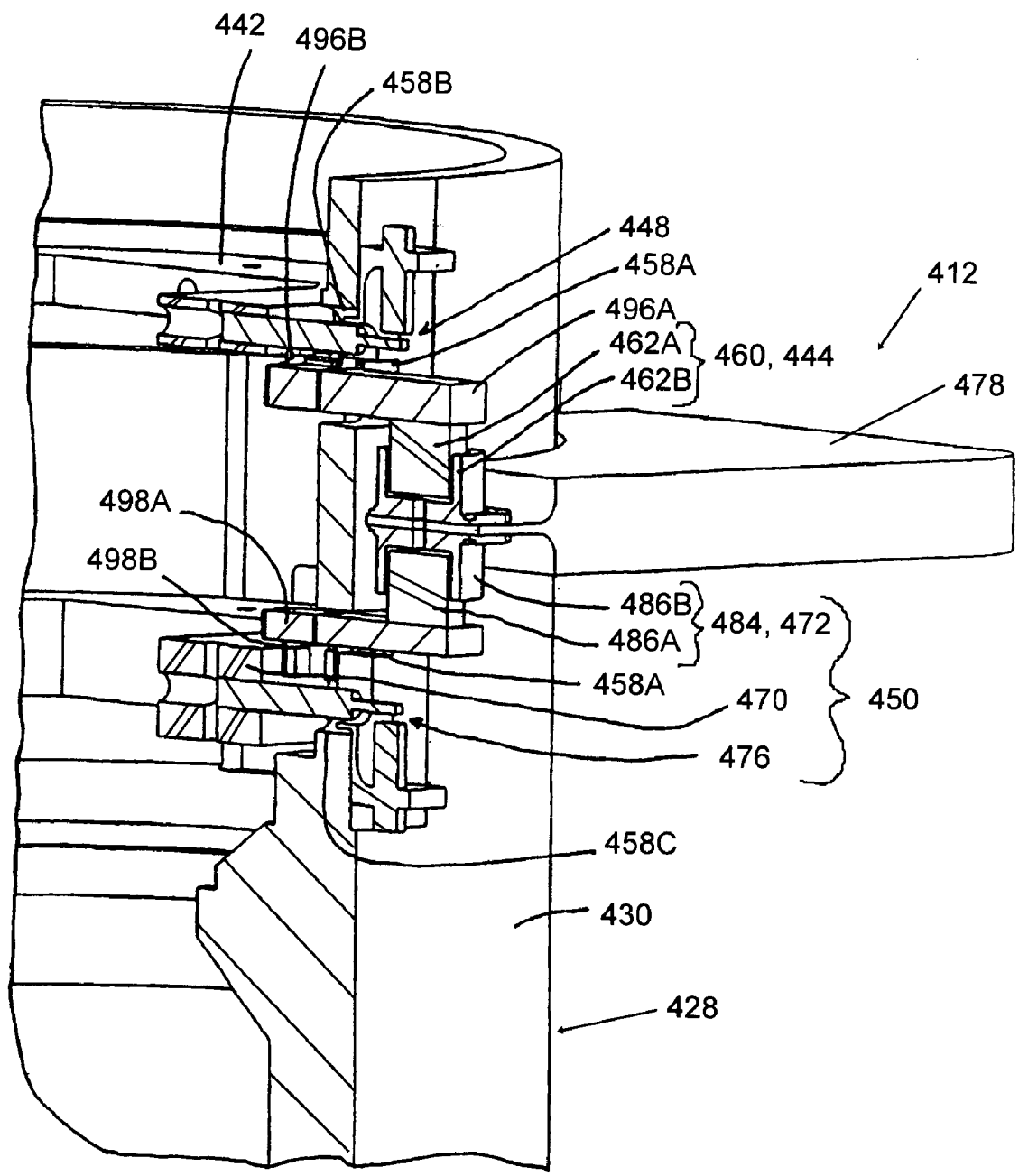
FIG. 4B illustrates the cutaway view of FIG. 4A at another angle.

FIGS. 4A and 4B illustrate another embodiment of a portion of an projection optical assembly 428 and an adjuster assembly 412 having features of the present invention. More specifically, FIGS. 4A and 4B illustrate a cut-away perspective view of a portion of the projection optical assembly 428, and a cut-away perspective view of a portion of the adjuster assembly 412. The projection optical assembly 428 and the adjuster assembly 412 can be utilized in the apparatus 10 illustrated in FIG. 1A or the apparatus 310 illustrated in FIG. 3A.

In this embodiment, the projection optical assembly 428 is somewhat similar to the projection optical assembly 228 illustrated in FIG. 2A and discussed above. The projection optical assembly 428 includes a projection optical housing 430 having two sets of housing apertures 458A, and bar apertures 458B, 458C. The projection optical elements are not illustrated in FIGS. 4A and 4B.

In FIGS. 4A and 4B, the adjuster assembly 412 is somewhat similar to the adjuster assembly 212 illustrated in FIG. 2A and described above. More specifically, the adjuster assembly 412 includes an adjuster (not shown), an adjuster stage 442, an adjuster stage mover assembly 444, and an adjuster measurement system 448 that are similar to the corresponding components described above and illustrated in FIG. 2A. Further, the adjuster assembly 412 includes a damper assembly 450 having a reaction counter mass 470, a mass mover assembly 472, and a reaction measurement system 476 that are somewhat similar to the corresponding components described above and illustrated in FIG. 2A.

However, in this embodiment the adjuster stage mover assembly 444 and the mass mover assembly 472 are positioned outside the projection optical housing 430. As a result thereof, the heat generated by the mover assemblies 444, 472 is not contained within the projection optical assembly 428. Further, this design can also allow for a more compact design within the optical housing 430. Moreover, with this design, the adjuster supports, the adjuster connectors, the mass supports, and the reaction connectors are not necessary.

More specifically, the adjuster stage mover assembly 444 includes one or more stage movers 460, each having a first component 462A and a second component 462B. The adjuster stage mover assembly 444 can include four stage movers 460 and each stage mover 460, for example, can be a voice coil motor. For each stage mover 460, (i) the first component 462A is secured with an upper reaction beam 496A and a flexible connector 496B to the adjuster stage 442 and (ii) the second component 462B is secured to a reaction frame 478. Each upper reaction beam 496A extends through one of the housing apertures 458A. The reaction frame 478 is flat plate shaped and includes an opening so that the reaction frame 478 encircles the projection optical assembly 428.

The mass mover assembly 472 includes one or more reaction movers 484, each having a first component 486A and a second component 486B. The mass mover assembly 472 can include four mass movers 484 and each mass mover 484, for example, can be a voice coil motor. For each mass mover 484, (i) the first component 486A is secured with a lower reaction beam 498A and a lower flexure 498B to the reaction counter mass 470 and (ii) the second component 486B is secured to the reaction frame 478. Each lower reaction beam 498A extends through one of the housing apertures 458A.

In this embodiment, the reaction frame 478 can be secured to (i) the projection optical housing 430 somewhat similar to the embodiment illustrated in FIGS. 2A–2D or (ii) to the mounting base with a base reaction frame 382C similar to the embodiment illustrated in FIGS. 3A–3E. However, in this embodiment, springs may not be necessary.

In the embodiment illustrated in FIGS. 4A and 4B, the control system directs current to the adjuster stage mover assembly 444 so that the adjuster stage mover assembly 444 applies an adjuster force to the adjuster 454 about the X axis and/or about the Y axis to move and/or tilt the adjuster 454. Substantially simultaneously, the control system directs current to the mass mover assembly 472 so that the mass mover assembly 472 applies a reaction force to the reaction counter mass 470 about the X axis and/or about the Y axis to move and/or tilt the reaction counter mass 470.

Further, with the teachings provided herein, the stage mover assembly 444 and the reaction assembly 450 illustrated in FIGS. 4A and 4B can be incorporated in a reticle stage assembly or a wafer stage assembly.

Figure 5:
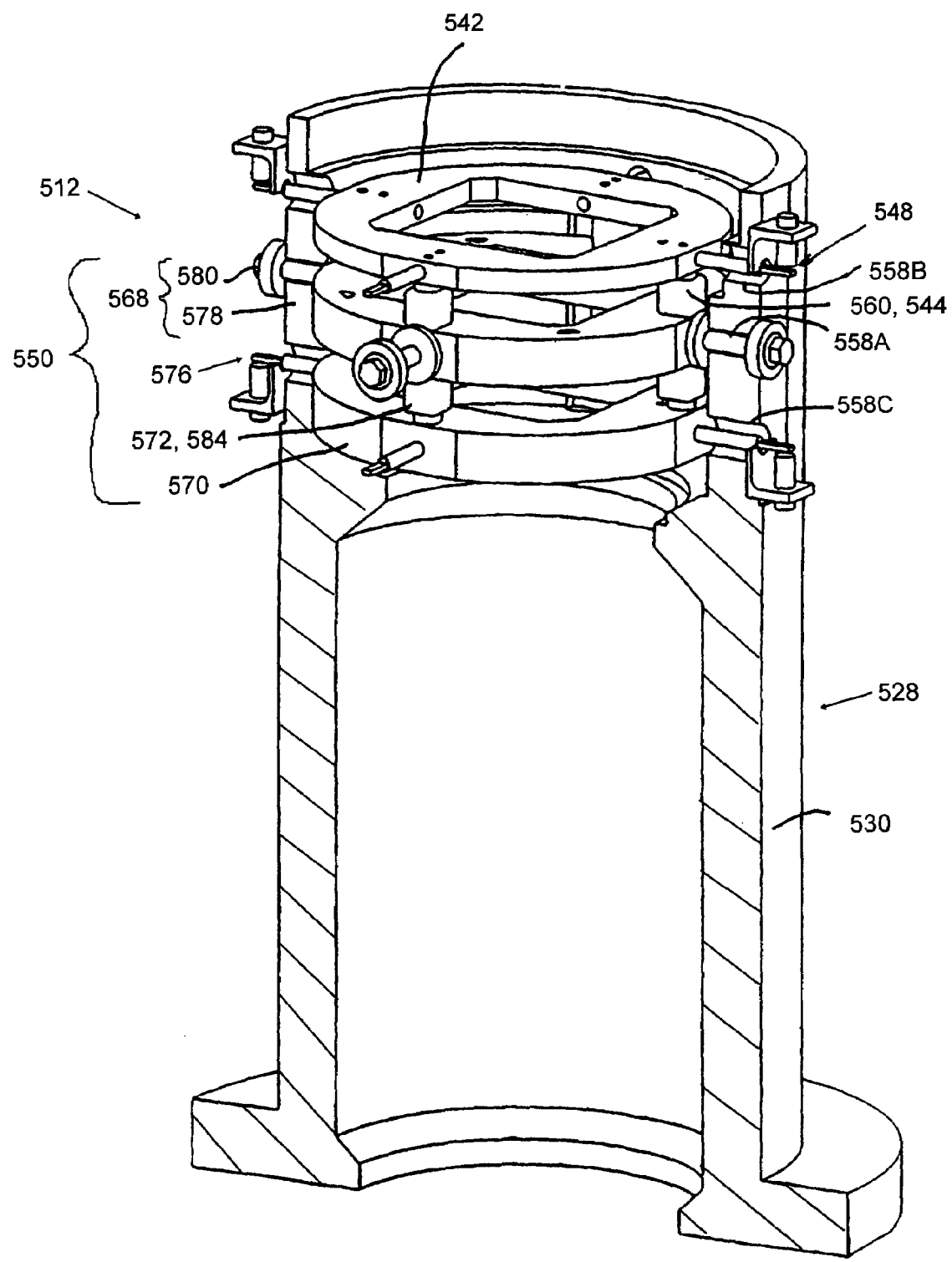
FIG. 5 is a perspective of still another embodiment of an adjuster assembly and a cutaway view of a projection optical assembly having features of the present invention.

FIG. 5 illustrates another embodiment of a portion of a projection optical assembly 528 and an adjuster assembly 512 having features of the present invention. More specifically, FIG. 5 illustrates a cut-away perspective view of a portion of the projection optical assembly 528, and a perspective view of the adjuster assembly 512. The projection optical assembly 528 and the adjuster assembly 512 can be utilized in the apparatus 10 illustrated in FIG. 1A.

In this embodiment, the projection optical assembly 528 is somewhat similar to the projection optical assembly 228 illustrated in FIG. 2A and discussed above. The projection optical assembly 528 includes a projection optical housing 530 having housing apertures 558A, and bar apertures 558B, 558C.

In FIG. 5, the adjuster assembly 512 is somewhat similar to the adjuster assembly 512 illustrated in FIG. 2A and described above. More specifically, the adjuster assembly 512 includes the adjuster (not shown), the adjuster stage 542, the adjuster stage mover assembly 544 including one or more stage movers 560, and the adjuster measurement system 548 that are similar to the corresponding components described above and illustrated in FIG. 2A. Further, the adjuster assembly 512 is a damper assembly 550 has (i) a reaction frame assembly 568 including a reaction frame 578 and reaction mounts 580, (ii) a reaction counter mass 570, (iii) a mass mover assembly 572 including one or more mass movers 584, and (iv) a reaction measurement system 576 that are somewhat similar to the corresponding components described above and illustrated in FIG. 2A.

In this embodiment, each of the four stage movers 560 and each of the four mass movers 584 is a piezoelectric transducer. Typically, piezoelectric transducers generate less heat and fewer components are necessary for the adjuster assembly 512. For example, with this design, the adjuster supports, the adjuster connectors, the mass supports and the reaction connectors are not necessary. The stage movers 560 and the mass movers 584 are coupled with the reaction frame assembly 568 to the projection optical housing 530.

In the embodiment illustrated in FIG. 5, the control system directs current to the adjuster stage mover assembly 544 so that the adjuster stage mover assembly 544 applies an adjuster force to the adjuster 554 about the X axis and/or about the Y axis to move and/or tilt the adjuster 554. Substantially simultaneously, the control system directs current to the mass mover assembly 572 so that the mass mover assembly 572 applies a reaction force to the reaction counter mass 570 about the X axis and/or about the Y axis to move and/or tilt the reaction counter mass 570.

Further, with the teachings provided herein, the stage mover assembly 544 and the reaction assembly 550 illustrated in FIG. 5 can be incorporated in a reticle stage assembly or a wafer stage assembly.

Figure 6:
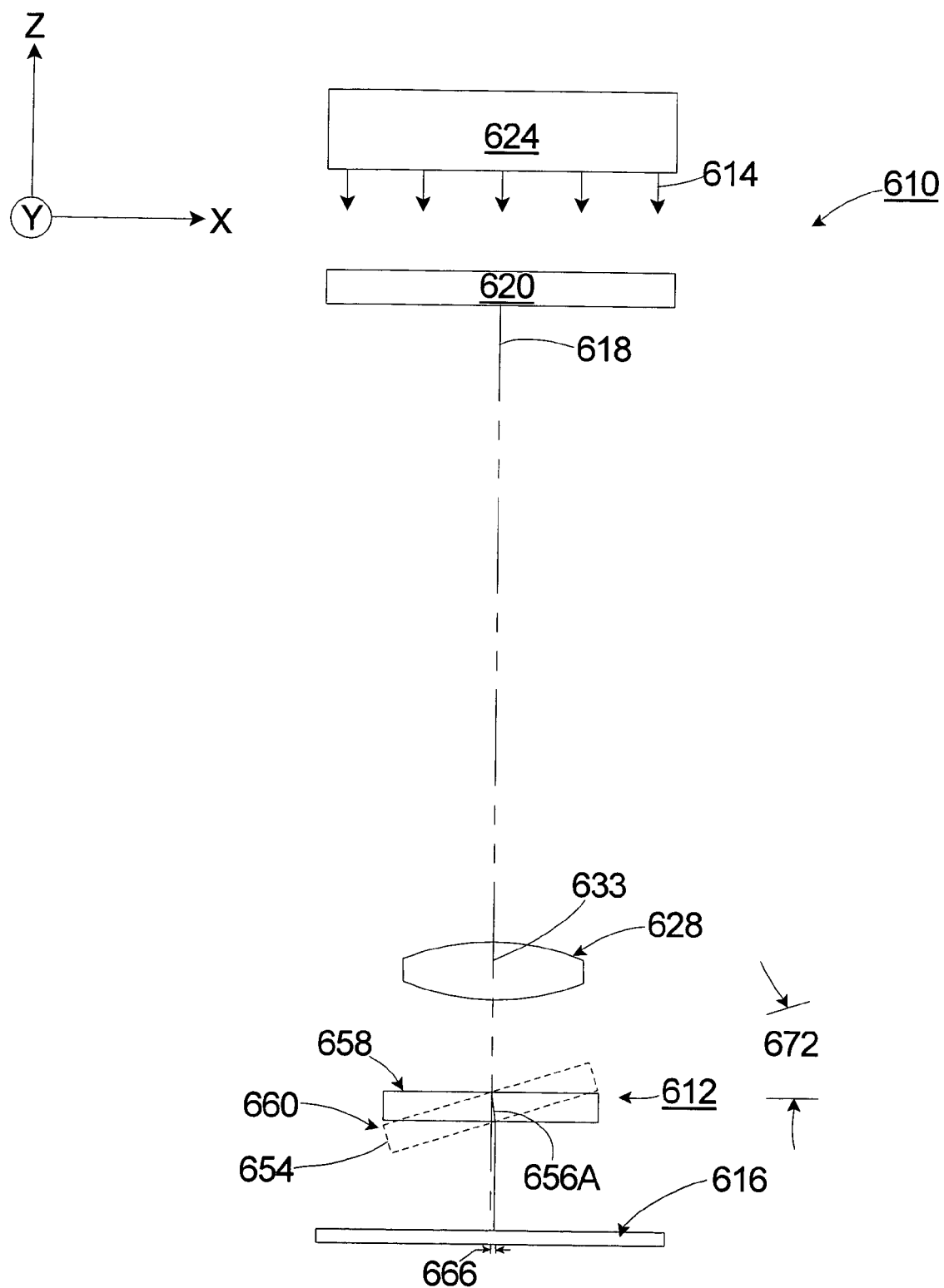
FIG. 6 is a schematic illustration of where the adjuster assembly can be positioned relative to the rest of the apparatus.

FIG. 6 is a simplified schematic illustration of another embodiment of an apparatus 610 having features of the present invention. This illustration is similar to the FIG. 1B illustration. In FIG. 6, the apparatus 610 includes an illumination system 624, a reticle 620, an adjuster 654 of an adjuster assembly 612, a projection optical assembly 628 including a projection optical axis 633, and a wafer 616. In this embodiment, the adjuster 654 is an optical element having an adjuster optical axis 656A. As illustrated in FIG. 6, the illumination system 624 directs the beam of light energy 614 (illustrated as arrows) towards the reticle 620. A portion of the beam of light energy 614 passes through the reticle 620 to create the projected image 618 of the integrated circuit that is directed towards the projection optical assembly 628, the adjuster 654 and the wafer 620.

Similar to the embodiment illustrated in FIG. 1B, during operation of the present invention, the adjuster 54 can be moved and/or tilted between a first position 658, a second position 660 (illustrated in phantom) and anywhere therebetween. The angle 672 of tilt and the offset 666 are also illustrated in FIG. 6. In both positions 658, 660, the projected image 618 passes through the adjuster 654. However, in this embodiment, the adjuster 654 is positioned below the projection optical assembly 628 and above the wafer 616.

A photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 7A:
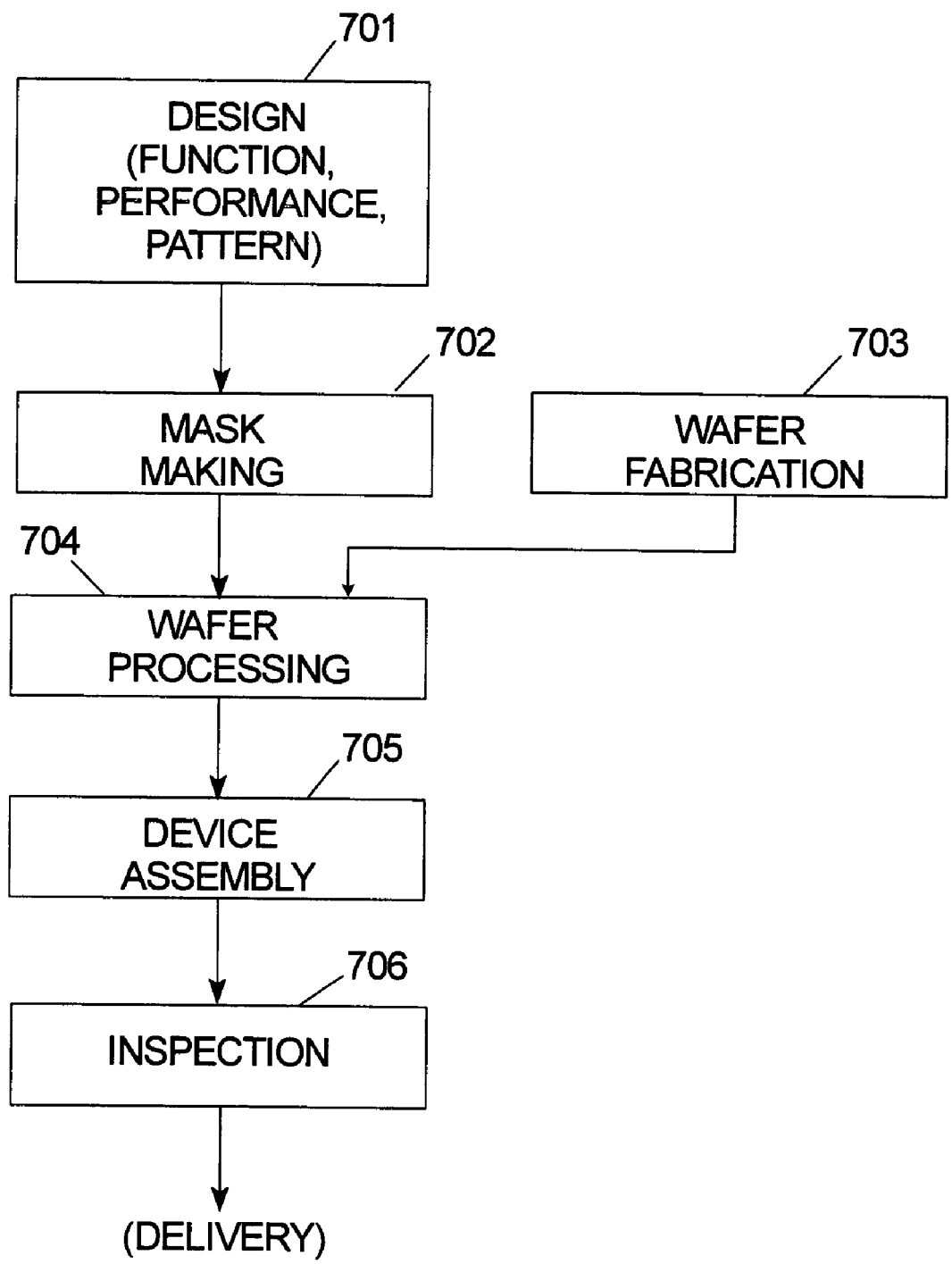
FIG. 7A is a flow chart that outlines a process for manufacturing a device in accordance with the present invention.

Further, semiconductor devices can be fabricated using the above described systems, by the process shown generally in FIG. 7A. In step 701 the device's function and performance characteristics are designed. Next, in step 702, a mask (reticle) having a pattern is designed according to the previous designing step, and in a parallel step 703 a wafer is made from a silicon material. The mask pattern designed in step 702 is exposed onto the wafer from step 703 in step 704 by a photolithography system described hereinabove in accordance with the present invention. In step 705 the semiconductor device is assembled (including the dicing process, bonding process and packaging process), finally, the device is then inspected in step 706.

Figure 7B:
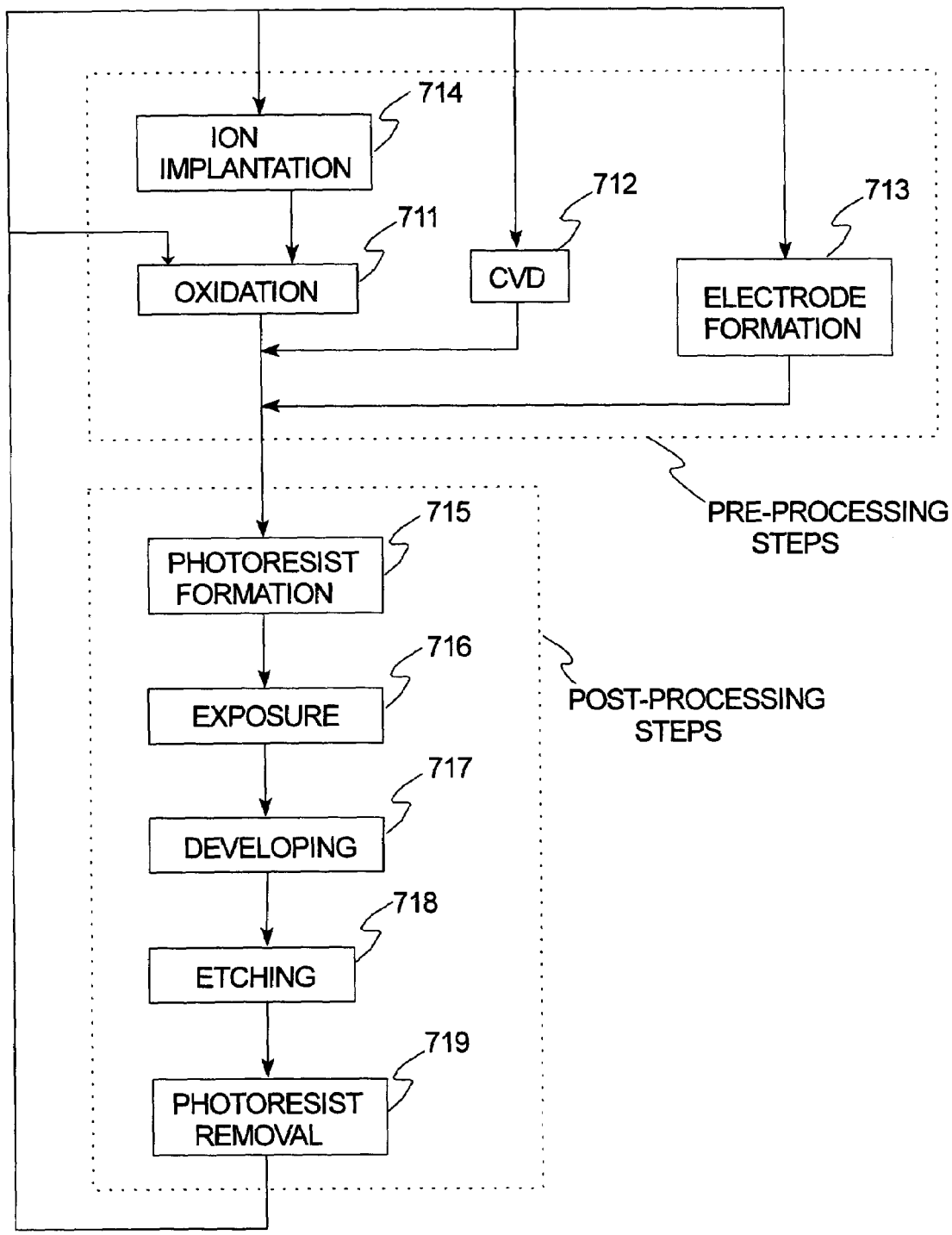
FIG. 7B is a flow chart that outlines device processing in more detail.

FIG. 7B illustrates a detailed flowchart example of the above-mentioned step 704 in the case of fabricating semiconductor devices. In FIG. 7B, in step 711 (oxidation step), the wafer surface is oxidized. In step 712 (CVD step), an insulation film is formed on the wafer surface. In step 713 (electrode formation step), electrodes are formed on the wafer by vapor deposition. In step 714 (ion implantation step), ions are implanted in the wafer. The above mentioned steps 711–714 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 715 (photoresist formation step), photoresist is applied to a wafer. Next, in step 716 (exposure step), the above-mentioned exposure device is used to transfer the circuit pattern of a mask (reticle) to a wafer. Then in step 717 (developing step), the exposed wafer is developed, and in step 718 (etching step), parts other than residual photoresist (exposed material surface) are removed by etching. In step 719 (photoresist removal step), unnecessary photoresist remaining after etching is removed.

Multiple circuit patterns are formed by repetition of these preprocessing and post-processing steps.

While the particular adjuster assembly as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. An adjuster assembly that adjusts the location where an image is transferred onto a device, the adjuster assembly comprising:

an adjuster optical element;

a stage mover assembly that adjusts the position of the adjuster optical element relative to the device so that the adjuster optical element adjusts along two axes where the image is transferred onto the device, wherein the adjuster optical element does not alter the shape or characteristics of the image; and an adjuster guide that allows for motion of the adjuster optical element about an X axis and about a Y axis and inhibits motion along the X axis and along the Y axis.

2. The adjuster assembly of claim 1 wherein the stage mover assembly moves the adjuster optical element between a first position and a second position relative to the device.

3. The adjuster assembly of claim 2 wherein, in the first position, the adjuster optical element does not substantially adjust where the image is transferred onto the device and in the second position, the adjuster optical element adjusts along two axes where the image is transferred onto the device.

4. The adjuster assembly of claim 1 wherein the stage mover assembly moves the adjuster optical element about the X axis relative to the device and the adjuster optical element adjusts where the image is transferred onto the device along the Y axis.

5. The adjuster assembly of claim 4 wherein the stage mover assembly moves the adjuster optical element about the Y axis relative to the device and the adjuster optical element adjusts where the image is transferred onto the device along the X axis.

6. The adjuster assembly of claim 1 wherein the stage mover assembly tilts the adjuster optical element relative to the device.

7. An apparatus for transferring a projected image from an object onto a device, the apparatus comprising the adjuster assembly of claim 1 positioned between the object and the device and a projection optical assembly positioned between the object and the device, the projection optical assembly focusing the projected image.

8. The apparatus of claim 7 wherein the projection optical assembly includes a projection optical axis and the stage mover assembly moves the adjuster optical element relative to the projection optical axis.

9. The apparatus of claim 8 wherein the adjuster optical element includes an adjuster optical axis and wherein the stage mover assembly tilts the adjuster optical axis between approximately zero and 50 microradians relative to the projection optical axis.

10. The apparatus of claim 8 wherein the adjuster optical element includes an adjuster optical axis and wherein the stage mover assembly tilts the adjuster optical axis between approximately zero and 5 milliradians relative to the projection optical axis.

11. The apparatus of claim 7 wherein the adjuster optical element is positioned within the projection optical assembly.

12. The apparatus of claim 11 wherein the stage mover assembly is positioned within the projection optical assembly.

13. The apparatus of claim 11 wherein the stage mover assembly is positioned outside the projection optical assembly.

14. The apparatus of claim 7 wherein the projection optical assembly includes a projection optical element and the stage mover assembly moves the adjuster optical element relative to the projection optical element.

15. The apparatus of claim 7 wherein the projection optical assembly includes a pair of projection optical elements, the adjuster optical element is positioned between the pair of projection optical elements and the stage mover assembly moves the adjuster optical element relative to the projection optical elements.

16. The apparatus of claim 7 further comprising an illumination system that directs a beam of light energy at the device, a reticle stage assembly that moves the object relative to the device, and a wafer stage assembly that moves the device relative to the object.

17. An apparatus for transferring a projected image from an object onto a device, the apparatus comprising:
   a projection optical assembly positioned between the object and the device, the projection optical assembly focusing the projected image;
   an adjuster assembly positioned at least partly within the projection optical assembly, the adjuster assembly comprising an adjuster optical element and a stage mover assembly that tilts the adjuster optical element relative to the device and the projection optical assembly so that the adjuster optical element adjusts where the image is transferred onto the device without otherwise altering the image; and
   an adjuster guide that allows for motion of the adjuster optical element about an X axis and about a Y axis and inhibits motion along the X axis and along the Y axis.

18. The apparatus of claim 17 wherein the stage mover assembly moves the adjuster optical element between a first position and a second position relative to the device, wherein, in the first position, the adjuster optical element does not substantially adjust where the image is transferred onto the device and in the second position, the adjuster optical element adjusts where the image is transferred onto the device.

19. The apparatus of claim 17 wherein the stage mover assembly moves the adjuster optical element about the X axis relative to the device and the adjuster optical element adjusts where the image is transferred onto the device along the Y axis and wherein the stage mover assembly moves the adjuster optical element about the Y axis relative to the device and the adjuster optical element adjusts where the image is transferred onto the device along the X axis.

20. The apparatus of claim 17 further comprising a damper assembly that is coupled to the stage mover assembly.

21. The apparatus of claim 20 wherein the damper assembly dampens vibration about an X axis and about a Y axis.

22. The apparatus of claim 20 wherein the damper assembly includes a reaction counter mass and a mass mover assembly.

23. The apparatus of claim 22 further comprising a mass guide that allows for motion of the reaction counter mass about the X axis and about the Y axis and inhibits motion along the X axis and along the Y axis.

24. The apparatus of claim 22 wherein when the stage mover assembly moves the adjuster optical element about an X axis in a first X rotational direction, the mass mover assembly moves the reaction counter mass about the X axis in a second X rotational direction that is substantially opposite the first X rotational direction, and wherein when the stage mover assembly moves the adjuster optical element about a Y axis in a first Y rotational direction, the mass mover assembly moves the reaction counter mass about the Y axis in a second Y rotational direction that is substantially opposite the first Y rotational direction.

25. The apparatus of claim 22 wherein the reaction counter mass is positioned within the projection optical assembly.

26. The apparatus of claim 25 wherein the mass mover assembly is positioned within the projection optical assembly.

27. The apparatus of claim 25 wherein the mass mover assembly is positioned outside the projection optical assembly.

28. The apparatus of claim 22 wherein the damper assembly includes a reaction frame that is coupled to the stage mover assembly.

29. The apparatus of claim 28 wherein the reaction frame is secured to the projection optical assembly with a mount damper, the mount damper inhibiting vibration from the reaction frame causing vibration to the projection optical assembly.

30. The apparatus of claim 28 wherein the reaction frame is secured with a base reaction frame to a mounting base.

31. The apparatus of claim 17 wherein the projection optical assembly includes a projection optical axis, the adjuster optical element includes an adjuster optical axis and the stage mover assembly tilts the adjuster optical axis between approximately zero and 5 milliradians relative to the projection optical axis.

32. The apparatus of claim 17 wherein the adjuster optical element is positioned within the projection optical assembly.

33. The apparatus of claim 32 wherein the stage mover assembly is positioned within the projection optical assembly.

34. The apparatus of claim 32 wherein the stage mover assembly is positioned outside the projection optical assembly.

35. The apparatus of claim 17 wherein the projection optical assembly includes a projection optical element and the stage mover assembly moves the adjuster optical element relative to the projection optical element.

36. The apparatus of claim 17 wherein the projection optical assembly includes a pair of projection optical elements, the adjuster optical element is positioned between the pair of projection optical elements and the stage mover assembly moves the adjuster optical element relative to the projection optical elements.

37. The apparatus of claim 17 further comprising an illumination system that directs a beam of light energy at the object, a reticle stage assembly that moves the object relative to the device, and a wafer stage assembly that moves the device relative to the object.

38. An adjuster assembly that adjusts the location where an image is transferred onto a device, the adjuster assembly comprising:
   an adjuster optical element;
   a stage mover assembly that adjusts the position of the adjuster optical element relative to the device so that the adjuster optical element adjusts along two axes where the image is transferred onto the device; and
   a damper assembly that is coupled to the stage mover assembly.

39. The adjuster assembly of claim 38 wherein the damper assembly dampens vibration about an X axis.

40. The adjuster assembly of claim 38 wherein the damper assembly dampens vibration about a Y axis.

41. The adjuster assembly of claim 38 wherein the damper assembly includes a reaction counter mass and a mass mover assembly.

42. The adjuster assembly of claim 41 further comprising a mass guide that allows for motion of the counter mass about the X axis and about the Y axis and inhibits motion of the counter mass along the X axis and along the Y axis.

43. The adjuster assembly of claim 41 wherein, when the stage mover assembly moves the adjuster optical element about an X axis in a first X rotational direction, the mass mover assembly moves the reaction counter mass about the X axis in a second X rotational direction that is substantially opposite the first X rotational direction.

44. The adjuster assembly of claim 43 wherein, when the stage mover assembly moves the adjuster optical element about a Y axis in a first Y rotational direction, the mass mover assembly moves the reaction counter mass about the Y axis in a second Y rotational direction that is substantially opposite the first Y rotational direction.

45. The adjuster assembly of claim 38 wherein the stage mover assembly moves the adjuster optical element between a first position and a second position relative to the device, and wherein, in the first position, the adjuster optical element does not substantially adjust where the image is transferred onto the device and in the second position, the adjuster optical element adjusts along two axes where the image is transferred onto the device.

46. The adjuster assembly of claim 38 wherein the adjuster optical element does not alter the image.

47. The adjuster assembly of claim 38 wherein the stage mover assembly moves the adjuster optical element about an X axis relative to the device and the adjuster optical element adjusts where the image is transferred onto the device along a Y axis, and wherein the stage mover assembly moves the adjuster optical element about the Y axis relative to the device and the adjuster optical element adjusts where the image is transferred onto the device along the X axis.

48. The adjuster assembly of claim 47 further comprising an adjuster guide that allows for motion of the adjuster about the X axis and about the Y axis and inhibits motion along the X axis and along the Y axis.

49. The adjuster assembly of claim 38 wherein the stage mover assembly tilts the adjuster optical element relative to the device.

50. An apparatus for transferring a projected image from an object onto a device, the apparatus comprising:
an adjuster assembly positioned between the object and the device, the adjuster assembly comprising (i) an adjuster optical element, (ii) a stage mover assembly that adjusts the position of the adjuster optical element relative to the device so that the adjuster optical element adjusts along two axes where the image is transferred onto the device, and (iii) a damper assembly that is coupled to the stage mover assembly; and
a projection optical assembly positioned between the object and the device, the projection optical assembly focusing the projected image.

51. The apparatus of claim 50 wherein the damper assembly includes a reaction counter mass and a mass mover assembly.

52. The apparatus of claim 51 wherein the reaction counter mass is positioned within the projection optical assembly.

53. The apparatus of claim 51 wherein the mass mover assembly is positioned within the projection optical assembly.

54. The apparatus of claim 51 wherein the mass mover assembly is positioned outside the projection optical assembly.

55. The apparatus of claim 54 wherein the stage mover assembly further comprises at least one actuator, the driving force of the actuator and a support force generated by the mass mover assembly lie on substantially the same axis.

56. The apparatus of claim 55, wherein the support force generated by the mass mover assembly is substantially perpendicular to the two axes.

57. The apparatus of claim 50 wherein the damper assembly includes a reaction frame that is coupled to the stage mover assembly.

58. The apparatus of claim 57 wherein the reaction frame is secured to the projection optical assembly with a mount damper, the mount damper inhibiting vibration from the reaction frame from causing vibration to the projection optical assembly.

59. The apparatus of claim 50 wherein the reaction frame is secured with a base reaction frame to a mounting base.

60. The apparatus of claim 50 wherein the adjuster optical element does not alter the image.

61. The apparatus of claim 50 wherein the projection optical assembly includes a projection optical axis and the stage mover assembly moves the adjuster optical element relative to the projection optical axis.

62. The apparatus of claim 61 wherein the adjuster optical element includes an adjuster optical axis and wherein the stage mover assembly tilts the adjuster optical axis between approximately zero and 50 microradians relative to the projection optical axis.

63. The apparatus of claim 61 wherein the adjuster optical element includes an adjuster optical axis and wherein the stage mover assembly tilts the adjuster optical axis between approximately zero and 5 milliradians relative to the projection optical axis.

64. The apparatus of claim 50 wherein the adjuster optical element is positioned within the projection optical assembly.

65. The apparatus of claim 64 wherein the stage mover assembly is positioned within the projection optical assembly.

66. The apparatus of claim 64 wherein the stage mover assembly is positioned outside the projection optical assembly.

67. The apparatus of claim 50 wherein the projection optical assembly includes a projection optical element and the stage mover assembly moves the adjuster optical element relative to the projection optical element.

68. The apparatus of claim 50 wherein the projection optical assembly includes a pair of projection optical elements, the adjuster optical element is positioned between the pair of projection optical elements and the stage mover assembly moves the adjuster optical element relative to the projection optical elements.

69. The apparatus of claim 50 further comprising an illumination system that directs a beam of light energy at the device, a reticle stage assembly that moves the object relative to the device, and a wafer stage assembly that moves the device relative to the object.

70. A stage assembly that moves an element relative to a mounting base, the stage assembly comprising:
a stage that retains the element;
a stage mover assembly that is coupled to the stage, the stage mover assembly moving the element about the X axis and generating reaction forces; and
a damper assembly that is coupled to the stage mover assembly, the damper assembly comprising a reaction counter mass and a mass mover assembly, wherein the mass mover assembly moves the reaction counter mass to counteract the reaction forces from the stage mover assembly, and wherein the damper assembly inhibits vibration from the stage mover assembly about the X axis from being transferred to the mounting base.

71. The stage assembly of claim 70 wherein the stage mover assembly moves the element about the Y axis and the damper assembly inhibits vibration from the stage mover assembly about the Y axis from being transferred to the mounting base.

72. The stage assembly of claim 71 further comprising a mass guide that allows for motion of the reaction counter mass about the X axis and about the Y axis and inhibits motion along the X axis and along the Y axis.

73. The stage assembly of claim 70 wherein when the stage mover assembly moves the element about an X axis in a first X rotational direction, the mass mover assembly moves the reaction counter mass about the X axis in a second X rotational direction that is substantially opposite the first X rotational direction.

74. The stage assembly of claim 73 wherein when the stage mover assembly moves the element about a Y axis in a first Y rotational direction, the mass mover assembly moves the reaction counter mass about the Y axis in a second Y rotational direction that is substantially opposite the first Y rotational direction.

75. The stage assembly of claim 70 wherein:
   the mounting base supports at least one optical system that has an optical path;
   the element includes an optical element that is disposed on the optical path; and
   the damper assembly inhibits vibration from the stage mover assembly from being transferred to the optical system.

76. An optical assembly mounted on the mounting base, the optical assembly comprising an optical housing and the stage assembly of claim 70 wherein the stage assembly is supported by the optical housing and the damper assembly inhibits vibration from the stage mover assembly from being transferred to the optical housing.

77. The optical assembly of claim 76 further comprising an optical path, wherein the element includes an optical element that is disposed on the optical path.

78. An adjuster assembly that adjusts the location where an image is transferred onto a device, the adjuster assembly comprising:
   an adjuster optical element; and
   a stage assembly comprising (i) a stage that retains the adjuster optical element, (ii) a stage mover assembly that is coupled to the stage, the stage mover assembly moving the adjuster optical element and generating reaction forces, wherein the stage mover assembly adjusts the position of the adjuster optical element relative to the device so that the adjuster optical element adjusts where the image is transferred onto the device, and (iii) a damper assembly that is coupled to the stage mover assembly, the damper assembly comprising a reaction counter mass and a mass mover assembly, wherein the mass mover assembly moves the reaction counter mass to counteract the reaction forces from the stage mover assembly.

79. The adjuster assembly of claim 78 wherein the stage mover assembly moves the adjuster optical element between a first position and a second position relative to the device.

80. The adjuster assembly of claim 79 wherein, in the first position, the adjuster optical element does not substantially adjust where the image is transferred onto the device and in the second position, the adjuster optical element adjusts where the image is transferred onto the device.

81. The adjuster assembly of claim 78 wherein the movement of the adjuster optical element does not substantially alter the image.

82. The adjuster assembly of claim 78 wherein the stage mover assembly moves the adjuster optical element about an X axis relative to the device and the adjuster optical element adjusts where the image is transferred onto the device along a Y axis.

83. The adjuster assembly of claim 82 wherein the stage mover assembly moves the adjuster optical element about the Y axis relative to the device and the adjuster optical element adjusts where the image is transferred onto the device along the X axis.

84. The adjuster assembly of claim 78 further comprising an adjuster guide that allows for motion of the adjuster optical element about the X axis and about the Y axis and inhibits motion along the X axis and along the Y axis.

85. The stage assembly of claim 78 further comprising a mass guide that allows for motion of the reaction counter mass about the X axis and about the Y axis and inhibits motion along the X axis and along the Y axis.

86. The adjuster assembly of claim 78 wherein the stage mover assembly tilts the adjuster optical element relative to the device.

87. An apparatus for transferring a projected image from an object onto a device, the apparatus comprising the adjuster assembly of claim 78 positioned between the object and the device and a projection optical assembly positioned between the object and the device, the projection optical assembly focusing the projected image.

88. The apparatus of claim 87 wherein the projection optical assembly includes a projection optical axis and the stage mover assembly moves the adjuster optical element relative to the projection optical axis.

89. The apparatus of claim 88 wherein the adjuster optical element includes an adjuster optical axis and wherein the stage mover assembly tilts the adjuster optical axis between approximately zero and 50 microradians relative to the projection optical axis.

90. The adjuster assembly of claim 88 wherein the adjuster optical element includes an adjuster optical axis and wherein the stage mover assembly tilts the adjuster optical axis between approximately zero and 5 milliradians relative to the projection optical axis.

91. The apparatus of claim 87 wherein the adjuster optical element is positioned within the projection optical assembly.

92. The apparatus of claim 91 wherein the stage mover assembly is positioned within the projection optical assembly.

93. The apparatus of claim 91 wherein the stage mover assembly is positioned outside the projection optical assembly.

94. The apparatus of claim 87 wherein the projection optical assembly includes a projection optical element and the stage mover assembly moves the adjuster optical element relative to the projection optical element.

95. The apparatus of claim 87 wherein the projection optical assembly includes a pair of projection optical elements, the adjuster optical element is positioned between the pair of projection optical elements and the stage mover assembly moves the adjuster optical element relative to the projection optical elements.

96. The apparatus of claim 87 wherein the reaction counter mass is positioned within the projection optical assembly.

97. The apparatus of claim 87 wherein the mass mover assembly is positioned within the projection optical assembly.

98. The apparatus of claim 87 wherein the mass mover assembly is positioned outside the projection optical assembly.

99. The apparatus of claim 87 wherein the damper assembly includes a reaction frame that is coupled to the stage mover assembly.

100. The apparatus of claim 99 wherein the reaction frame is secured to the projection optical assembly with a mount damper, the mount damper inhibiting vibration from the reaction frame causing vibration to the projection optical assembly.

101. The apparatus of claim 99 wherein the reaction frame is secured with a base reaction frame to the mounting base.

102. The apparatus of claim 87 further comprising an illumination system that directs a beam of light energy at the object, a reticle stage assembly that moves the object relative to the device, and a wafer stage assembly that moves the device relative to the object.

103. A method for adjusting the location where an image is transferred onto a device, the method comprising the steps of:
providing an adjuster optical element;
moving the adjuster optical element with a stage mover assembly relative to the device so that the adjuster optical element adjusts where the image is transferred onto the device; and
damping vibration from the stage mover assembly with a damper assembly that is coupled to the stage mover assembly.

104. The method of claim 103 wherein the step of damping vibration includes the steps of damping vibration about an X axis and damping vibration about a Y axis.

105. The method of claim 103 wherein the step of damping includes the step of providing a damper assembly having a reaction counter mass and a mass mover assembly, wherein when the stage mover assembly moves the adjuster optical element about an X axis in a first X rotational direction, the mass mover assembly moves the reaction counter mass about the X axis in a second X rotational direction that is substantially opposite the first X rotational direction, and wherein when the stage mover assembly moves the adjuster optical element about a Y axis in a first Y rotational direction, the mass mover assembly moves the reaction counter mass about the Y axis in a second Y rotational direction that is substantially opposite the first Y rotational direction.

106. The method of claim 103 wherein the step of moving the adjuster optical element includes the steps of moving the adjuster optical element between a first position and a second position relative to the device, wherein, in the first position, the adjuster optical element does not substantially adjust where the image is transferred onto the device and in the second position, the adjuster optical element adjusts where the image is transferred onto the device.

107. The method of claim 103 wherein the step of moving the adjuster optical element includes the steps of moving the adjuster optical element about an X axis relative to the device to adjust where the image is transferred onto the device along a Y axis and moving the adjuster optical element about the Y axis relative to the device to adjust where the image is transferred onto the device along the X axis.

108. A method for making an apparatus that transfers a projected image from an object onto a device, the method comprising the steps of adjusting the location where an image is transferred onto a device by the method of claim 103 and focusing the projected image with a projection optical assembly positioned between the object and the device.

109. The method of claim 108 wherein the step of moving the adjuster optical element includes the step of tilting the adjuster optical element relative to a projection optical axis of the projection optical assembly.

110. The method of claim 108 further comprising the step of positioning the adjuster optical element within the projection optical assembly.

111. The method of claim 110 further comprising the step of positioning the stage mover assembly within the projection optical assembly.

112. The method of claim 110 further comprising the step of positioning the stage mover assembly outside the projection optical assembly.

113. The method of claim 110 further comprising the step of positioning the adjuster optical element between a pair of projection optical elements of the projection optical assembly.

114. The method of claim 108 further comprising the steps of directing a beam of light energy at the object, moving the object relative to the device with a reticle mover assembly, and moving the device relative to the object with a wafer stage assembly.

115. A method for making a stage assembly that moves an element relative to a mounting base, the method comprising the steps of:
providing a stage frame that retains the element;
moving the stage frame about an X axis and about a Y axis with a stage mover assembly, the stage mover assembly generating reaction forces;
coupling a damping assembly to the stage mover assembly, the damping assembly including a reaction counter mass and a mass mover assembly; and
reducing the reaction forces about the X axis and about the Y axis that are transferred to the mounting base by moving the reaction counter mass with the mass mover assembly.

116. The method of claim 115 wherein the step of moving the stage frame includes the step of moving the stage frame about an X axis in a first X rotational direction, and the step of reducing the reaction forces includes the step of moving the reaction counter mass about the X axis in a second X rotational direction that is substantially opposite the first X rotational direction.

117. The method of claim 116 wherein the step of moving the stage frame includes the step of moving the stage frame about a Y axis in a first Y rotational direction, and the step of reducing the reaction forces includes the step of moving the reaction counter mass about the Y axis in a second Y rotational direction that is substantially opposite the first Y rotational direction.

118. A method for adjusting the location where an image is transferred onto a device, the method comprising the steps of:
providing an adjuster optical element;
providing a stage assembly made by (i) providing an stage frame that retains the adjuster optical element, (ii) moving the stage frame with a stage mover assembly, the stage mover assembly generating reaction forces, (iii) coupling a damping assembly to the stage mover assembly, the damping assembly including a reaction counter mass and a mass mover assembly, and (iv) reducing the reaction forces that are transferred to the mounting base by moving the reaction counter mass with the mass mover assembly; and moving the adjuster optical element with the stage assembly relative to the device so that the adjuster optical element adjusts where the image is transferred onto the device.

119. The method of claim 118 wherein the step of moving includes the steps of moving the adjuster optical element between a first position and a second position relative to the device, wherein, in the first position, the adjuster optical element does not substantially adjust where the image is transferred onto the device and in the second position, the adjuster optical element adjusts where the image is transferred onto the device.

120. The method of claim 118 wherein the step of moving the adjuster optical element includes the steps of moving the adjuster optical element about an X axis in a first X rotational direction relative to the device to adjust where the image is transferred onto the device along a Y axis and moving the adjuster optical element about the Y axis in a first Y rotational direction relative to the device to adjust where the image is transferred onto the device along the X axis.

121. The method of claim 120 wherein the step of reducing the reaction forces includes the steps of moving the reaction counter mass about the X axis in a second X rotational direction that is substantially opposite the first X rotational direction and moving the reaction counter mass about the Y axis in a second Y rotational direction that is substantially opposite the first Y rotational direction.

122. A method for making an apparatus that transfers a projected image from an object onto a device, the method comprising the steps of adjusting the location where an image is transferred onto the device by the method of claim 118 and focusing the projected image with a projection optical assembly positioned between the object and the device.

123. The method of claim 122 wherein the step of moving the adjuster optical element includes the step of tilting the adjuster optical element relative to a projection optical axis of the projection optical assembly.

124. The method of claim 122 further comprising the step of positioning the projection optical element within the projection optical assembly.

125. The method of claim 122 further comprising the step of positioning the stage mover assembly within the projection optical assembly.

126. The method of claim 122 further comprising the step of positioning the stage mover assembly outside the projection optical assembly.

127. The method of claim 122 further comprising the step of positioning the adjuster optical element between a pair of projection optical elements of the projection optical assembly.

128. The method of claim 122 further comprising the steps of directing a beam of light energy at the device, moving the device relative to the object with a reticle mover assembly, and moving the object relative to the device with a wafer stage assembly.

129. An apparatus for transferring a projected image from an object onto a device, the apparatus comprising:

a projection optical assembly positioned between the object and the device, the projection optical assembly focusing the projected image;

an adjuster assembly positioned at least partly within the projection optical assembly, the adjuster assembly comprising an adjuster optical element and a stage mover assembly that tilts the adjuster optical element relative to the device and the projection optical assembly so that the adjuster optical element adjusts where the image is transferred onto the device without otherwise altering the image; and a damper assembly that is coupled to the stage mover assembly.

130. The apparatus of claim 129 wherein the damper assembly dampens vibration about an X axis and about a Y axis.

131. The apparatus of claim 129 wherein the damper assembly includes a reaction counter mass and a mass mover assembly.

132. The apparatus of claim 131 further comprising a mass guide that allows for motion of the reaction counter mass about the X axis and about the Y axis and inhibits motion along the X axis and along the Y axis.

133. The apparatus of claim 131 wherein when the stage mover assembly moves the adjuster optical element about an X axis in a first X rotational direction, the mass mover assembly moves the reaction counter mass about the X axis in a second X rotational direction that is substantially opposite the first X rotational direction, and wherein when the stage mover assembly moves the adjuster optical element about a Y axis in a first Y rotational direction, the mass mover assembly moves the reaction counter mass about the Y axis in a second Y rotational direction that is substantially opposite the first Y rotational direction.

134. The apparatus of claim 131 wherein the reaction counter mass is positioned within the projection optical assembly.

135. The apparatus of claim 134 wherein the mass mover assembly is positioned within the projection optical assembly.

136. The apparatus of claim 134 wherein the mass mover assembly is positioned outside the projection optical assembly.

137. The apparatus of claim 131 wherein the damper assembly includes a reaction frame that is coupled to the stage mover assembly.

138. The apparatus of claim 137 wherein the reaction frame is secured to the projection optical assembly with a mount damper, the mount damper inhibiting vibration from the reaction frame causing vibration to the projection optical assembly.

139. The apparatus of claim 137 wherein the reaction frame is secured with a base reaction frame to a mounting base.

* * * * *

UNITED STATES PATENT AND TRADEMARK OFFICE
CERTIFICATE OF CORRECTION

| | | |
|---|---|---|
| PATENT NO. | : 7,061,577 B2 | Page 1 of 1 |
| APPLICATION NO. | : 10/107269 | |
| DATED | : June 13, 2006 | |
| INVENTOR(S) | : Yuan et al. | |

It is certified that error appears in the above-identified patent and that said Letters Patent is hereby corrected as shown below:

On the Title Page under the heading "U.S. PATENT DOCUMENTS", please add -- 6,836,093  12/2004  Nishi, Kenji --.

On the Title Page under the heading "FOREIGN PATENT DOCUMENTS", please add -- WO/98/28665  07/1998 -- and -- WO/98/40791  09/1998--.

Signed and Sealed this

Twenty-eighth Day of November, 2006

JON W. DUDAS
*Director of the United States Patent and Trademark Office*